(12) United States Patent
Okuyama et al.

(10) Patent No.: US 11,332,670 B2
(45) Date of Patent: *May 17, 2022

(54) SIDE-CHAIN LIQUID CRYSTAL POLYMER, LIQUID CRYSTAL COMPOSITION, RETARDATION FILM, METHOD FOR PRODUCING RETARDATION FILM, TRANSFER LAMINATE, OPTICAL MEMBER, METHOD FOR PRODUCING OPTICAL MEMBER, AND DISPLAY DEVICE

(71) Applicant: DAI NIPPON PRINTING CO., LTD., Tokyo-to (JP)

(72) Inventors: Ken-ichi Okuyama, Tokyo-to (JP); Kiyohiro Takachi, Tokyo-to (JP); Shunsuke Irie, Tokyo-to (JP); Mami Motooka, Tokyo-to (JP); Terutaka Takahashi, Tokyo-to (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/313,689

(22) PCT Filed: Jun. 14, 2017

(86) PCT No.: PCT/JP2017/021935
§ 371 (c)(1),
(2) Date: Dec. 27, 2018

(87) PCT Pub. No.: WO2018/003498
PCT Pub. Date: Jan. 4, 2018

(65) Prior Publication Data
US 2019/0136134 A1 May 9, 2019

(30) Foreign Application Priority Data

Jun. 28, 2016 (JP) .............................. JP2016-128192

(51) Int. Cl.
*C09K 19/54* (2006.01)
*C09K 19/38* (2006.01)
*C08F 220/12* (2006.01)
*G02B 5/30* (2006.01)
*C08F 222/10* (2006.01)
(Continued)

(52) U.S. Cl.
CPC ........ *C09K 19/3852* (2013.01); *C08F 220/12* (2013.01); *C08F 222/1025* (2020.02);
(Continued)

(58) Field of Classification Search
CPC ....................................................... G02F 1/13
See application file for complete search history.

(56) References Cited

U.S. PATENT DOCUMENTS 6,344,154 B1* 2/2002 Coates .................... C07C 69/92
252/299.63
2004/0046926 A1* 3/2004 Ishizaki ............... G02B 5/3083
349/194
(Continued)

FOREIGN PATENT DOCUMENTS

CN 1589414 A 3/2005
CN 100439948 C 12/2008
(Continued)

OTHER PUBLICATIONS

Translation for CN 104177881 A (Year: 2020).*
(Continued)

*Primary Examiner* — Chanceity N Robinson
(74) *Attorney, Agent, or Firm* — Oliff PLC

(57) ABSTRACT

A side-chain liquid crystal polymer including two or more kinds of constitutional units represented by the following general formula (I) and a liquid crystal constitutional unit which contains a side chain including a liquid crystal moiety, where the two or more kinds of constitutional units represented by the general formula (I) include a constitutional (Continued)

unit (a) represented by the general formula (I) and a constitutional unit (b) which is represented by the general formula (I) and is different from the constitutional unit (a) in carbon atom number of a linking group represented by $L^1$ or $L^{1'}$. The general formula (I) is:

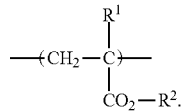

21 Claims, 3 Drawing Sheets

(51) Int. Cl.
*G02B 1/08* (2006.01)
*H01L 51/00* (2006.01)
*H01L 51/52* (2006.01)
*C09K 19/04* (2006.01)
*H01L 51/56* (2006.01)

(52) U.S. Cl.
CPC ............ *C09K 19/54* (2013.01); *G02B 1/08* (2013.01); *G02B 5/3016* (2013.01); *G02B 5/3033* (2013.01); *G02B 5/3083* (2013.01); *H01L 51/004* (2013.01); *H01L 51/0076* (2013.01); *H01L 51/5281* (2013.01); *C08F 2800/20* (2013.01); *C09K 2019/0448* (2013.01); *H01L 51/56* (2013.01); *H01L 2251/5338* (2013.01); *H01L 2251/558* (2013.01)

(56) References Cited

U.S. PATENT DOCUMENTS

| | | | |
|---|---|---|---|
| 2005/0037155 A1 | 2/2005 | Shuto et al. | |
| 2005/0227021 A1* | 10/2005 | Harding | C07C 69/734 428/1.1 |
| 2011/0090439 A1* | 4/2011 | Nakamura | G02B 5/3016 349/117 |
| 2018/0046034 A1* | 2/2018 | Lim | G02F 1/13378 |

FOREIGN PATENT DOCUMENTS

| | | | |
|---|---|---|---|
| CN | 102043185 A | | 5/2011 |
| CN | 104177881 A | * | 12/2014 |
| JP | 2000-507932 A | | 6/2000 |
| JP | 2003-149441 A | | 5/2003 |
| JP | 2005-120091 A | | 5/2005 |
| JP | 2005-272561 A | | 10/2005 |
| JP | 2005272561 A | * | 10/2005 |
| JP | 2007-332230 A | | 12/2007 |
| JP | 2011-128584 A | | 6/2011 |
| JP | 2014-123068 A | | 7/2014 |
| JP | 2015-007700 A | | 1/2015 |
| JP | 2015-197526 A | | 11/2015 |
| JP | 2018-095736 A | | 6/2018 |
| KR | 20150093447 A | * | 8/2015 |
| WO | 2016/167231 A1 | | 10/2016 |
| WO | WO-2016167231 A1 | * | 10/2016 ............. C08L 33/06 |

OTHER PUBLICATIONS

Translation for KR 20150093447 (Year: 2020).*
Takehiko Fujimoto, "The Handbook of surfactants", Sanyo Chemical Industries, Ltd., Jun. 1, 2007, Section II, Chapter 6 (The relationship between the chemical structure and physical properties of surfactants) p. 140-p. 166.
J.T Davies and E.K. Rideal, "Interfacial Phenomena", Academic Press, New York, 1963, p. 371-383.
Dec. 25, 2018 International Search Report issued in International Patent Application No. PCT/JP2018/035394.
Apr. 9, 2021 Office Action issued in U.S. Appl. No. 16/650,756.
Jul. 12, 2021 Office Action issued in U.S. Appl. No. 16/650,756.
Oct. 28, 2021 Office Action issued in U.S. Appl. No. 16/650,756.
U.S. Patent Application No. 2005/0037155a1, previously cited in the IDS filed Jan. 10, 2019.
Mar. 15, 2022 Notice of Allowance Issued In U.S. Appl. No. 16/650,756.

* cited by examiner

SIDE-CHAIN LIQUID CRYSTAL POLYMER, LIQUID CRYSTAL COMPOSITION, RETARDATION FILM, METHOD FOR PRODUCING RETARDATION FILM, TRANSFER LAMINATE, OPTICAL MEMBER, METHOD FOR PRODUCING OPTICAL MEMBER, AND DISPLAY DEVICE

TECHNICAL FIELD

The present disclosure relates to a side-chain liquid crystal polymer, a liquid crystal composition, a retardation film and a method for producing the retardation film, a transfer laminate, an optical member and a method for producing the optical member, and a display device.

BACKGROUND ART

Hitherto, about display devices such as a liquid crystal display device and a light emitting display device, a structure has been suggested in which various optical members are arranged onto their panel plane. For such an optical member, suggested is also a structure to which retardation is given by a liquid crystal material.

For example, in a light emitting display device such as an organic light emitting display device, a metallic electrode excellent in reflectivity is fitted thereto in order to use light from its light emitting layer effectively. In the meantime, the use of the metallic electrode makes the reflection of external light large. Thus, the light emitting display device has, for example, a circularly polarizing plate to restrain the external light reflection.

Light transmitted through a polarizing plate has an optical anisotropy. This anisotropy causes a display device to be, for example, lowered in contrast dependently on the viewing angle. By contrast, a method is known in which a retardation film, particularly, a positive C type retardation film (positive C plate) is used to improve the viewing angle.

The positive C plate can be yielded, for example, by aligning rodlike liquid crystal molecules in its plate homeotropically to the plane of the plate.

For example, Patent Literature 1 discloses a retardation plate having a homeotropic alignment liquid crystal film made of a homeotropic alignment liquid crystal composition containing a specific homeotropic alignment side-chain liquid crystal polymer, and a photopolymerizable liquid crystal compound.

CITATION LIST

Patent Literature

Patent Literature 1: JP 2003-149441 A

SUMMARY OF INVENTION

Technical Problem

An object of embodiments in the present disclosure is to provide a side-chain liquid crystal polymer capable of forming a retardation layer excellent in resistance to bending and high in in-plane uniformity of retardation value; a liquid crystal composition including the side-chain liquid crystal polymer; a retardation film containing a retardation layer excellent in resistance to bending and high in in-plane uniformity of retardation value, and a method for producing the retardation film; a transfer laminate configured to transfer a retardation layer excellent in resistance to bending and high in in-plane uniformity of retardation value; an optical member containing the retardation film, and a method for producing the optical member; and a display device.

Solution to Problem

One embodiment in the present disclosure provides a side-chain liquid crystal polymer including two or more kinds of constitutional units which are represented by the following general formula (I) and a liquid crystal constitutional unit which contains a side chain including a liquid crystal moiety, in which the two or more kinds of constitutional units represented by the following general formula (I) include the following:

a constitutional unit (a) represented by the following general formula (I)

a constitutional unit (b) which is represented by the following general formula (I) and is different from the constitutional unit (a) in carbon atom number of a linking group represented by $L^1$ or $L^{1'}$:

[Chem. 1]

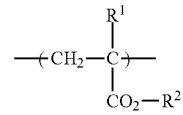

General Formula (I)

where $R^1$ is a hydrogen atom or a methyl group; $R^2$ is a group represented by $-L^1-R^3$ or $-L^{1'}-R^4$; $L^1$ is the linking group and represented by $-(CH_2)_n-$; $L^{1'}$ is the linking group and represented by $-(C_2H_4O)_{n'}-$; $R^3$ is a methyl group optionally containing a substituent group, an aryl group optionally containing an alkyl group, or $-OR^5$; $R^4$ and $R^5$ are each independently an alkyl group optionally containing a substituent group or an aryl group optionally containing a substituent group; and n and n' are each independently an integer of 1 or more and 18 or less.

One embodiment in the present disclosure provides the side-chain liquid crystal polymer in which the liquid crystal constitutional unit includes a constitutional unit represented by the following general formula (II):

[Chem. 2]

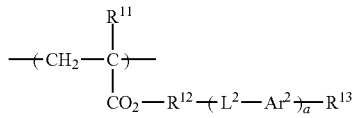

General Formula (II)

where $R^{11}$ is a hydrogen atom or a methyl group; $R^{12}$ is a group represented by $-(CH_2)_m-$ or $-(C_2H_4O)_{m'}-$; $L^2$ is a direct bond or a linking group represented by $-O-$, $-O-C(=O)-$ or $-C(=O)-O-$; $Ar^2$ is an arylene group containing 6 or more and 10 or less carbon atoms and optionally containing a substituent group; $L^2$s may be the same as or different from each other, and $Ar^2$s may be the same as or different from each other; $R^{13}$ is $-F$, $-Cl$, $-CN$, $-OCF_3$, $-OCF_2H$, $-NCO$, $-NCS$, $-NO_2$, $-NHC(=O)-R^{14}$, $-C(=O)-OR^{14}$, $-OH$, $-SH$, —CHO, —SO$_3$H, —NR$^{14}_2$, —R$^{15}$, or —OR$^5$; R$^{14}$ is a hydrogen atom or an alkyl group containing 1 or more and 6 or less carbon atoms; R$^{15}$ is an alkyl group containing 1 or more and 6 or less carbon atoms; and a is an integer of 2 or more and 4 or less; and m and m' are each independently an integer of 2 or more and 10 or less.

One embodiment in the present disclosure provides a liquid crystal composition including the side-chain liquid crystal polymer according to any one of the embodiments concerned in the present disclosure, a polymerizable liquid crystal compound, and a photopolymerization initiator.

One embodiment in the present disclosure provides a retardation film including a retardation layer, in which the retardation layer contains the side-chain liquid crystal polymer according to any one of the embodiments concerned in the present disclosure.

One embodiment in the present disclosure provides a retardation film including a retardation layer, in which the retardation layer contains a cured product of a liquid crystal composition containing the side-chain liquid crystal polymer according to any one of the embodiments concerned in the present disclosure and a polymerizable liquid crystal compound.

One embodiment in the present disclosure provides a method for producing a retardation film, in which a retardation layer is formed by: a step of forming, into a film, a liquid crystal composition containing the side-chain liquid crystal polymer according to any one of the embodiments concerned in the present disclosure, a polymerizable liquid crystal compound and a photopolymerization initiator, a step of aligning a liquid crystal constitutional unit of the side-chain liquid crystal polymer and the polymerizable liquid crystal compound in the liquid crystal composition formed into the film, and a step of polymerizing the polymerizable liquid crystal compound after the aligning step.

One embodiment in the present disclosure provides a transfer laminate configured to transfer a retardation layer, in which the transfer laminate includes a retardation layer and a support supporting the retardation layer in a removable manner, and in which the retardation layer contains a cured product of a liquid crystal composition containing the side-chain liquid crystal polymer according to any one of the embodiments concerned in the present disclosure and a polymerizable liquid crystal compound.

One embodiment in the present disclosure provides an optical member including the retardation film in the present disclosure and a polarization plate disposed thereon.

One embodiment in the present disclosure provides a method for producing an optical member, the method including:

a step of preparing a transfer laminate configured to transfer a retardation layer, in which the transfer laminate includes a retardation layer and a support supporting the retardation layer in a removable manner, and in which the retardation layer contains a cured product of a liquid crystal composition containing the side-chain liquid crystal polymer according to any one of the embodiments concerned in the present disclosure and a polymerizable liquid crystal compound, a transfer step in which a transfer receiving object including at least a polarization plate, is faced to the retardation layer of the transfer laminate, and the transfer laminate is transferred onto the transfer receiving object, and a removal step in which the support is removed from the transfer laminate transferred onto the transfer receiving object.

One embodiment in the present disclosure provides a display device including the retardation film according to any one of the embodiments concerned in the present disclosure or including an optical member including the retardation film and a polarization plate disposed thereon.

Advantageous Effects of Invention

The embodiments in the disclosure can provide a side-chain liquid crystal polymer capable of forming a retardation layer excellent in resistance to bending and high in in-plane uniformity of retardation value; a liquid crystal composition including the side-chain liquid crystal polymer; a retardation film containing a retardation layer excellent in resistance to bending and high in in-plane uniformity of retardation value, and a method for producing the retardation film; a transfer laminate configured to transfer a retardation layer excellent in resistance to bending and high in in-plane uniformity of retardation value; an optical member containing the retardation film, and a method for producing the optical member; and a display device.

Figure 1:
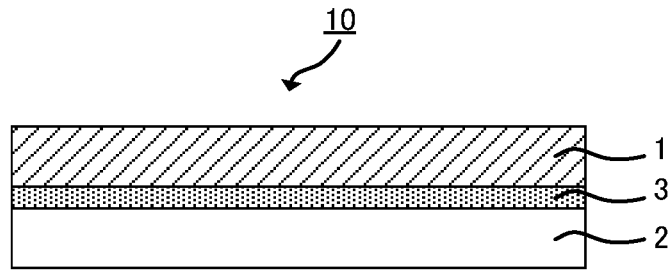
FIG. 1 is a schematic sectional view showing an embodiment of a retardation film.

Hereinafter, descriptions will be made about embodiments, working examples and others in the present disclosure with reference to the drawings and so on. However, about the present disclosure, many different embodiments can be carried out. Thus, the present invention should not be interpreted with any limitation to described contents of the embodiments, the working examples, and the others, which will be given as examples. In order to make a description about each of the drawings clearer, the width, the thickness, the shape and any other factors of each part or portion therein may be schematically illustrated, differently from that of a part or portion in an actual form. However, the illustrated factors are each a mere example not to limit the interpretation of the present disclosure. In the document DESCRIPTION, and each of the drawings, to the same element as in any one of the drawings referred to already is attached the same reference number; thus, a detailed description thereabout is appropriately omitted. For the convenience of the descriptions, any word such as a word "upward" or "downward" may be used. However, the direction represented by the word may be flipped upside down.

In the DESCRIPTION, in a case where, for example, any member or a constituent of any region is "on (or beneath) of a different member or a constituent of a different region, examples of this case include not only a case where the member is just on (or just beneath) of the different constituent, but also a case where the member or the constituent is over or above (or under or below) of the different constituent, that is, a case where an additional member is included between the two to be over or above (or under or below) the constituent unless otherwise specified.

The alignment-regulating force in the present disclosure means an interaction that causes a liquid crystal compound in a retardation layer to be arranged in a specific direction.

In the present disclosure, the wording "(meth)acryl(ic)" denotes each of the words "acryl(ic) and methacryl(ic)". The wording "(meth)acrylate" denotes each of the words "acrylate" and "methacrylate". The wording "(meth)acryloyl" denotes each of words "acryloyl" and "methacryloyl".

In the present DESCRIPTION, the terms "plate", "sheet" and "film" should not be distinguished from each other on the basis of a difference between their designations. The wording "film plane (plate plane or sheet plane)" denotes the following when a film-form (plate-form or sheet-form) member which is a target is viewed wholly and macroscopically: a plane of the film-form member (plate-form member or sheet-form member), which is the target, the direction of this plane being consistent with the flat plane direction of the member.

A. Side-Chain Liquid Crystal Polymer

A side-chain liquid crystal polymer in the present disclosure is a side-chain liquid crystal polymer including two or more kinds of constitutional units which are represented by a general formula (I) illustrated below and a liquid crystal constitutional unit which contains a side chain including a liquid crystal moiety, in which the two or more kinds of constitutional units represented by the general formula (I) illustrated below include:

a constitutional unit (a) which is represented by the general formula (I) illustrated below, and a constitutional unit (b) which is represented by the general formula (I) illustrated below and is different from the constitutional unit (a) in carbon atom number of a linking group represented by $L^1$ or $L^{1'}$.

In other words, the side-chain liquid crystal polymer in the present disclosure is a side-chain liquid crystal polymer including a copolymer containing at least the following: constitutional units represented by a general formula (I) illustrated below, these constitutional units being two or more kinds of constitutional units which are different from each other in carbon atom number of a linking group represented by $L^1$ or $L^{1'}$; and a liquid crystal constitutional unit.

Incidentally, the side-chain liquid crystal polymer in the present disclosure may include, as the constitutional units each represented by the general formula (I), three or more kinds of constitutional units different from each other in carbon atom number of a linking group represented by $L^1$ or $L^{1'}$. In other words, the side-chain liquid crystal polymer in the present disclosure may be a polymer further including the following besides the constitutional unit (a) and the constitutional unit (b): one or more kinds of constitutional units which are represented by the general formula (I) and which are different from the constitutional unit (a) and the constitutional unit (b) in carbon atom number of a linking group represented by $L^1$ or $L^{1'}$.

[Chem. 3]

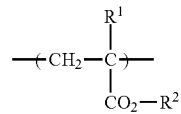

General Formula (I)

where $R^1$ is a hydrogen atom or a methyl group; $R^2$ is a group represented by $-L^1-R^3$ or $-L^{1'}-R^4$; L is the linking group and represented by $-(CH_2)_n-$; $L^{1'}$ is the linking group and represented by $-(C_2H_4O)_{n'}-$; $R^3$ is a methyl group optionally containing a substituent group, an aryl group optionally containing an alkyl group, or $-OR^5$; $R^4$ and $R^5$ are each independently an alkyl group optionally containing a substituent group or an aryl group optionally containing a substituent group; and n and n' are each independently an integer of 1 or more and 18 or less.

In the general formula (I), $R^2$ represents a group represented by $-L^1-R^3$ or $-L^{1'}-R^4$; L is the linking group and represented by $-(CH_2)_n-$, and $L^{1'}$ is the linking group and represented by $-(C_2H_4O)_{n'}-$; and the side-chain liquid crystal polymer contains, in the molecule thereof, two or more kinds of constitutional units which are different from each other in carbon atom number of a linking group represented by $L^1$ or $L^{1'}$.

In one embodiment in the present disclosure, the side-chain liquid crystal polymer contains the two or more kinds of constitutional units, which are different from each other in carbon atom number of a linking group represented by $L^1$ or $L^{1'}$. Thus, the side-chain liquid crystal polymer is excellent in compatibility with a polymerizable liquid crystal compound that will be detailed later. Moreover, $R^2$ in the general formula (I) is easily arranged along the liquid crystal moiety which each side chain of the liquid crystal constituent unit contains; for this reason, the $R^2$ is located to be extended in a direction perpendicular to a substrate or an alignment membrane, so that a void is formed which is surrounded by each long side chain of the polymer over each short side chain thereof. The polymerizable liquid crystal compound easily enters the void, so that the polymerizable liquid crystal compound is easily homeotropically aligned. Consequently, a retardation layer can be yielded which is high in in-plane uniformity of retardation value. Such a matter is presumed. It is also presumed about the side-chain liquid crystal polymer in the present disclosure that: the linking group represented by $L^1$ or $L^{1'}$ of the constitutional units represented by the general formula (I) has a flexible structure; and a synergetic effect of this structure with the matter that the polymer contains the void makes it possible that this polymer forms a retardation layer which is strong against bending not to be easily broken. Furthermore, it is presumed that in the side-chain liquid crystal polymer in the present disclosure, the polymerizable liquid crystal compound enters the void to be homeotropically aligned to make it possible that the polymerizable liquid crystal compound which has been once aligned homeotropically is not liable to be moved. This matter makes it easy that the polymerizable liquid crystal compound is homeotropically aligned even at low temperature. Thus, an advantage effect that a process margin is widened is also produced.

Examples of a combination of $R^2$s in the constitutional units represented by the general formula (I) include the following:

(A) a combination including $-(CH_2)_{n1}-R^3$ and $-(CH_2)_{n2}-R^3$ in which n1 and n2 are numerical values different from each other, (B) a combination including —(C$_2$H$_4$O)$_{n1'}$—R$^4$ and —(C$_2$H$_4$O)$_{n2'}$—R$^4$ in which n1' and n2' are numerical values different from each other, and (C) a combination including —(CH$_2$)$_{n1}$—R$^3$ and —(C$_2$H$_4$O)$_{n2'}$—R$^4$ in which n1 and n2' are numerical values different from each other.

Each of the combinations (A), (B) and (C) may further include another constitutional unit represented by the general formula (I).

Plural R$^3$s, as well as plural R$^4$s, are each independently from each other regardless of the numerical value of n or n'. The plural R$^3$s, as well as plural R$^4$s, may be the same as or different from each other.

As the substituent which the methyl group in each of R$^3$s may contain, examples include halogen atoms such as fluorine, chlorine, and bromine atoms.

The aryl group in R$^3$ is not particularly limited, and is preferably an aryl group containing 6 or more and 20 or less carbon atoms from the viewpoint of the resistance to bending, and the in-plane uniformity of retardation value. Specific examples thereof include phenyl, naphthyl, and antracenyl groups. Out of these examples, a phenyl or naphthyl group is preferred. A phenyl group is more preferred.

The alkyl group which the aryl group in R$^3$ may contain is not particularly limited, and is preferably an alkyl group containing 1 or more and 12 or less carbon atoms, more preferably an alkyl group containing 5 or more and 10 or less carbon atoms from the viewpoint of the resistance to bending, and the in-plane uniformity of retardation value. The alkyl group may be a linear alkyl group, or may be an alkyl group containing a branched structure or a cyclic structure. Specific examples of the alkyl group include methyl, ethyl, propyl, butyl, pentyl, hexyl, heptyl, octyl, nonyl, decyl, cyclopentyl, cyclohexyl, cyclohexylmethyl, cyclohexylethyl, cyclohexylpropyl, methylcyclohexyl, ethylcyclohexyl, and propylcyclohexyl groups. A hydrogen atom which the alkyl group contains may be substituted with a halogen atom.

The alkyl group in each of R$^4$ and R$^5$ is not particularly limited, and is preferably an alkyl group containing 1 or more and 12 or less carbon atoms from the viewpoint of the resistance to bending, and the in-plane uniformity of retardation value. The alkyl group may be a linear alkyl group, or may be an alkyl group containing a branched or cyclic structure. Specific examples of the alkyl group include the same groups as given as the examples of the alkyl group which the aryl group in R$^3$ may contain. As the substituent which the alkyl group may contain in each of R$^4$ and R$^5$, examples include halogen atoms. Examples of the aryl group in each of R$^4$ and R$^5$ include the same groups as in R$^3$. As the substituent which the aryl group may contain in each of R$^4$ and R$^5$, examples include alkyl groups, and halogen atoms. Examples of the alkyl groups and the halogen atoms include the same groups and atoms as given as the examples of the alkyl group or the halogen atom which R$^3$ may contain as the substituent.

Specific examples of each of the constitutional units represented by the general formula (I) include units illustrated below. However, the constitutional unit is not limited to these examples.

[Chem. 4]

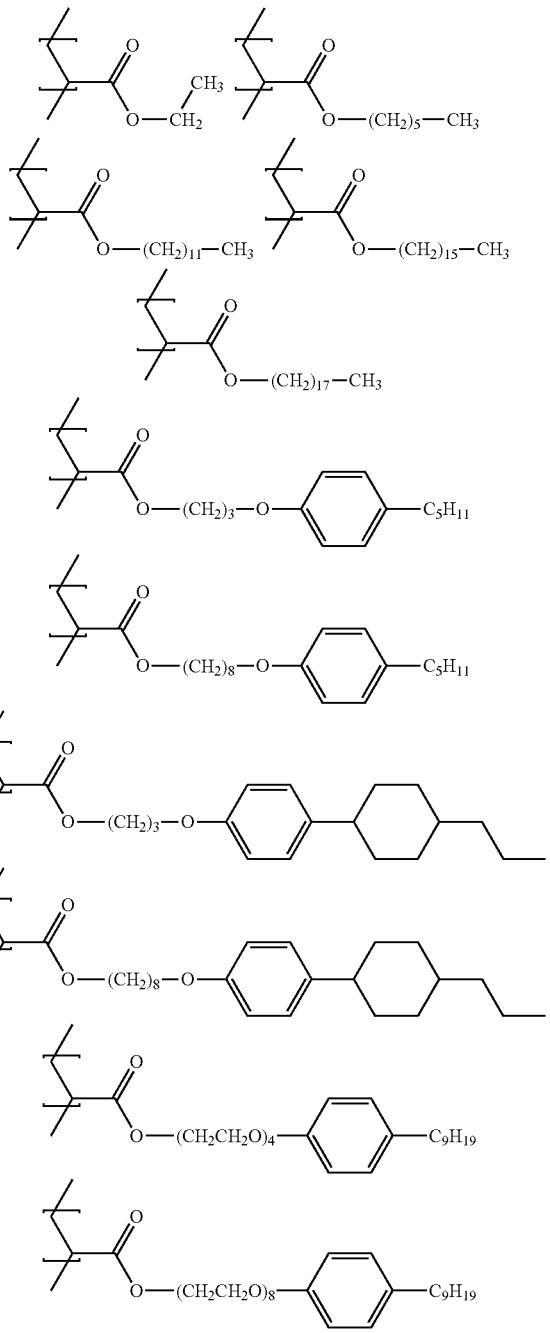

In each of the constitutional units represented by the general formula (I), n and n' are each independently an integer of 1 or more and 18 or less; and n and n' are each independently preferably an integer of 2 or more. n' is preferably 10 or less.

In each of the constitutional units represented by the general formula (I), the combination of the value of n with that of n' is not particularly limited; from the viewpoint of the resistance to bending, and the in-plane uniformity of retardation value, the combination permits the difference between the total numbers of carbon atoms and oxygen atoms included in the respective linking groups represented by L$^1$ or L$^{1'}$ to be preferably 3 or more and be more preferably 5 or more. More preferably, the combination permits the difference between the numbers of carbon atoms included in the respective linking groups represented by $L^1$ or $L^{1'}$ to be preferably 3 or more, more preferably 5 or more.

Specifically, when the polymer contains, for example, linking groups represented by —$(CH_2)_n$— and different from each other in length, the following can be stated: out of two or more kinds of ns, the maximum n value is represented by $n_M$ and the minimum n value is represented by $n_m$; in this case, the difference between $n_M$ and $n_m$ ($n_M$-$n_m$) is preferably 3 or more, more preferably 5 or more.

When the polymer contains, for example, linking groups represented by —$(C_2H_4O)_{n'}$— groups and different from each other in length, the following can be stated: out of two or more kinds of n's, the maximum n' value is represented by $n'_M$ and the minimum n' value is represented by $n'_m$; in this case, the difference between $n'_M$ and $n'_m$ ($n'_M$-$n'_m$) is preferably 1 or more, more preferably 2 or more, even more preferably 3 or more.

When any one of these relationships is satisfied, a void is produced which has a sufficient volume that the polymerizable liquid crystal compound enters. Thus, the polymerizable liquid crystal compound is improved in homeotropic alignment property to increase the in-plane uniformity of retardation value, and further the retardation layer has flexibility and is also improved in resistance to bending.

About the constitutional units represented by the general formula (I), the ratio between the two or more kinds of constitutional units different from each other in carbon atom number of a linking groups represented by $L^1$ or $L^2$ is not particularly limited. The following ratio is preferably from 1/9 to 9/1, more preferably from 2/8 to 8/2: the ratio by mole of the constitutional unit containing the linking group about which the carbon atom number is the largest to the constitutional unit containing the linking group about which the carbon atom number is the smallest.

In the embodiment in the present disclosure, the liquid crystal constitutional unit contains a side chain including a liquid crystal moiety, that is, a moiety showing liquid crystal property. The liquid crystal constitutional unit is preferably a constitutional unit containing, at its side chain, a mesogen showing liquid crystal property. The liquid crystal constitutional unit is preferably a constitutional unit derived from a compound showing liquid crystal property in which a polymerizable group is bonded to a mesogen group to interpose a spacer therebetween. In the present disclosure, the mesogen denotes a moiety having a high rigidity so as to show liquid crystal property. Examples thereof include a partial structure which contains two or more cyclic structures, preferably three or more cyclic structures and which is a structure in which the cyclic structures are bonded directly to each other or the cyclic structures are bonded to each other to interpose 1 to 3 atoms therebetween. When the side chain contains such a moiety showing liquid crystal property, the liquid crystal constitutional unit is homeotropically aligned with ease.

The cyclic structures may each be an aromatic ring such as benzene, naphthalene or anthracene, or may be a cyclic aliphatic hydrocarbon such as cyclopentyl or cyclohexyl.

When the cyclic structures are bonded to each other to interpose 1 to 3 atoms therebetween, examples of the structure of this linking moiety include —O—, —S—, —O—C(=O)—, —C(=O)—O—, —O—C(=O)—O—, —NR—C(=O)—, —C(=O)—NR—, —O—C(=O)—NR—, —NR—C(=O)—O—, —NR—C(=O)—NR—, —O—NR—, and —NR—O— where Rs are each a hydrogen atom or a hydrocarbon group.

The mesogen is in particular preferably a rodlike mesogen in which, for example, benzene rings are bonded to each other at their para-positions, or naphthalene rings are bonded to each other at their 2,6-positions to make the linkage of the cyclic structures into a rod form.

When the liquid crystal constitutional unit is a constitutional unit including, at its side chain, a mesogen showing liquid crystal property, the terminal of the side chain of the constitutional unit is preferably a polar group or preferably contains an alkyl group from the viewpoint of the homeotropic alignment property. Specific examples of the polar group include —F, —Cl, —CN, —OCF_3, —OCF_2H, —NCO, —NCS, —NO_2, —NHC(=O)—R', —C(=O)—OR', —OH, —SH, —CHO, —SO_3H, —NR'_2, —R", or —OR" where R's are each a hydrogen atom or a hydrocarbon, and R"s are each an alkyl group.

In the embodiment in the present disclosure, one kind of the liquid crystal constitutional unit may be singly used, or two or more kinds of such units may be used in combination.

The liquid crystal constitutional unit is preferably a constitutional unit derived from a monomer which contains a group containing an ethylenic double bond and which is polymerizable with the general formula (I). Examples of the monomer, which contains a group containing an ethylenic double bond, include (meth)acrylic acid esters, styrene, (meth)acrylamide, maleimide, vinyl ethers, vinyl esters, and other derivatives. The liquid crystal constitutional unit is in particular preferably a constitutional unit derived from a (meth)acrylic acid ester from the viewpoint of the homeotropic alignment property.

In the embodiment in the present disclosure, the liquid crystal constitutional units preferably include a constitutional unit represented by the following general formula (II) from the viewpoint of the homeotropic alignment property:

[Chem. 5]

General Formula (II)

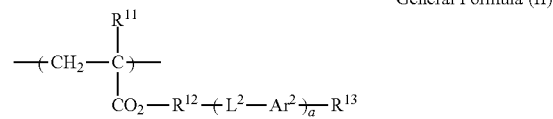

where $R^{11}$ is a hydrogen atom or a methyl group; $R^{12}$ is a group represented by —$(CH_2)_m$— or —$(C_2H_4O)_{m'}$—; $L^2$ is a direct bond or a linking group represented by —O—, —O—C(=O)— or —C(=O)—O—; $Ar^2$ is an arylene group containing 6 or more and 10 or less carbon atoms and optionally containing a substituent group; $L^2$s may be the same as or different from each other, and $Ar^2$s may be the same as or different from each other; $R^{13}$ is —F, —Cl, —CN, —OCF_3, —OCF_2H, —NCO, —NCS, —NO_2, —NHC(=O)—$R^{14}$, —C(=O)—$OR^{14}$, —OH, —SH, —CHO, —SO_3H, —$NR^{14}_2$, —$R^{15}$, or —$OR^{15}$; $R^{14}$ is a hydrogen atom or an alkyl group containing 1 or more and 6 or less carbon atoms; $R^{15}$ is an alkyl group containing 1 or more and 6 or less carbon atoms; and a is an integer of 2 or more and 4 or less; and m and m' are each independently an integer of 2 or more and 10 or less.

In $R^{12}$, m and m' are each independently an integer of 2 or more and 10 or less. From the viewpoint of the homeotropic alignment property, m and m' are in particular preferably 2 or more and 8 or less, more preferably 2 or more and 6 or less.

Examples of the arylene group containing 6 or more and 10 or less carbon atoms and optionally containing a substituent in $Ar^2$ include phenylene and naphthylene groups. Out of these groups, a phenylene group is more preferred. Examples of the substituent which the arylene group may contain, besides $R^{13}$, include alkyl groups containing 1 or more and 5 or less carbon atoms, and halogen atoms such as fluorine, chlorine and bromine atoms.

In $R^{13}$, $R^{14}$ is a hydrogen atom, or an alkyl group containing 1 or more and 6 or less carbon atoms. $R^{14}$ is in particular preferably a hydrogen atom, or an alkyl group containing 1 or more and 3 or less carbon atoms. In $R^{13}$, $R^{15}$ is an alkyl group containing 1 or more and 6 or less carbon atoms. $R^{15}$ is in particular preferably an alkyl group containing 1 or more and 5 or less carbon atoms.

Preferred and specific examples of the liquid crystal constitutional unit represented by the general formula (II) include constitutional units represented by the following chemical formulae (II-1), (II-2), and (II-3), respectively. However, the liquid crystal constitutional unit is not limited to these examples.

[Chem. 6]

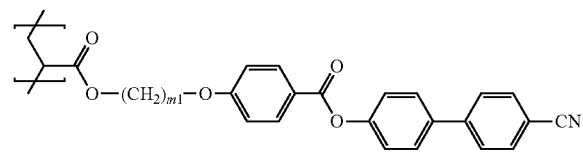

Chemical Formula (II-1)

(m1 is an integer of 2 or more and 6 or less.)

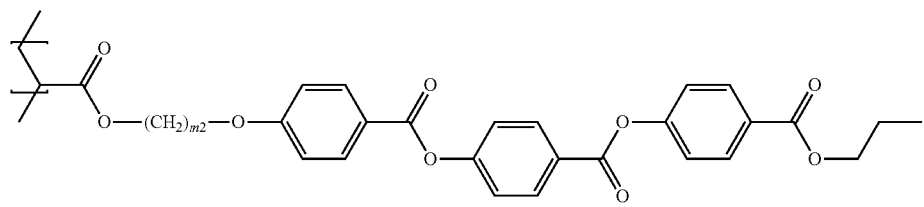

Chemical Formula (II-2)

(m2 is an integer of 2 or more and 6 or less.)

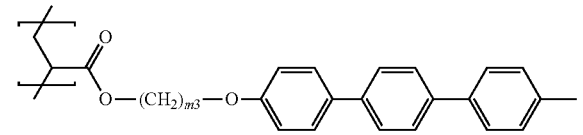

Chemical Formula (II-3)

(m3 is an integer of 2 or more and 6 or less.)

In the embodiment in the present disclosure, the side-chain liquid crystal polymer may be a block copolymer containing block moieties made of the constitutional units represented by the general formula (I), and block moieties made of liquid crystal constitutional units; or may be a random copolymer in which the constitutional units represented by the general formula (I) and liquid crystal constitutional units are irregularly arranged. In the present embodiment, the random copolymer is preferred in order to improve the polymerizable liquid crystal compound in homeotropic alignment property and in-plane uniformity of retardation value and to form the retardation layer which is not easily broken.

In the side-chain liquid crystal polymer, the presence ratio between the constitutional units represented by the general formula (I) and the liquid crystal constitutional units is not particularly limited. The ratio by mole of the constitutional units represented by the general formula (I) and the liquid crystal constitutional units is preferably from 1/9 to 9/1, more preferably from 2/8 to 8/2.

(3) Different Constitutional Unit

In the embodiment in the present disclosure, the side-chain liquid crystal polymer in the disclosure may contain, besides the constitutional units represented by the general formula (I) and the liquid crystal constitutional unit, a different constitutional unit which falls under neither any constitutional unit represented by the general formula (I) nor the liquid crystal constitutional unit, as far as advantageous effects of the present embodiment are not impaired. When the side-chain liquid crystal polymer in the present disclosure contains the different constitutional unit, the polymer can be heightened in, for example, solvent solubility, heat resistance, and reactivity.

One kind of the different constitutional unit may be singly used, or two or more kinds of such units may be used in combination. The content by percentage of the different constitutional unit is preferably in the range of 0% or more and 30% or less, more preferably in the range of 0% or more and 20% or less by mole of the whole of the side-chain liquid crystal polymer, the proportion of which is 100% by mole. If the content proportion of the constitutional unit is large, the content proportion of the liquid crystal constitutional unit and the constitutional units represented by the general formula (I) becomes relatively small, so that the advantageous effects of the present embodiment may not be easily gained.

In the embodiment in the present disclosure, the mass-average molecular weight Mw of the side-chain liquid crystal polymer is not particularly limited, and is preferably in the range of 500 or more and 60000 or less, more preferably in the range of 3000 or more and 55000 or less, even more preferably in the range of 4000 or more and 40000 or less. When the mass-average molecular weight is in any one of the ranges, the resultant liquid crystal composition is excellent in stability, and the composition is excellent in handleability when made into a retardation layer.

Incidentally, the mass-average molecular weight Mw is a value measured by GPC (gel permeation chromatography). The measurement is made, using an instrument HLC-8120GPC manufactured by Tosoh Corp., and using N-methylpyrrolidone into which 0.01 mole/L of lithium bromide is added as an eluting solvent; using polymers of Mw 377400, 210500, 96000, 50400, 206500, 10850, 5460, 2930, 1300, and 580 (Easi PS-2 series, each manufactured by Polymer Laboratories Ltd.) and a polymer of Mw 1090000 (manufactured by Tosoh Corp.) as polystyrene standards for calibration curves; and two columns TSK-GEL ALPHA-M (manufactured by Tosoh Corp.) as measuring columns.

(Production of Side-Chain Liquid Crystal Polymer)

In the present embodiment, a method for producing the side-chain liquid crystal polymer is not particularly limited. For example, it is advisable to mix monomers from which constitutional units represented by the general formula (I) are derived with a monomer from which a liquid crystal constitutional unit is derived at a desired ratio, and then polymerize the monomers into a desired average molecular weight, using a known polymerizing means.

Moreover, when the polymer is rendered a block copolymer, for example, the following method can be given: a method of using a known polymerizing means, respectively, to polymerize monomers from which constitutional units represented by the general formula (I) are derived, and a monomer from which a liquid crystal constitutional unit is derived, and then linking the resultant individual polymers to each other; or a method of using a known polymerizing means to polymerize one of a monomer from which a liquid crystal constitutional unit is derived, and monomers from which constitutional units represented by the general formula (I) are derived, adding the other monomer(s) thereto, and further polymerizing this mixture.

The polymerizing means may each be a method used ordinarily for polymerizing a compound containing a vinyl group, and is, for example, anion polymerization or living radical polymerization. In the present embodiments, it is particularly preferred to use a method in which polymerization advances in a living manner, such as group transfer polymerization (GTP), as disclosed in "J. Am. Chem. Soc." 105, 5706 (1983). This method makes it easy to set the molecular weight, and the molecular weight distribution of the resultant polymer into desired ranges; thus, the resultant side-chain liquid crystal polymer can be made uniform in properties.

In the present disclosure, the structure of the side-chain liquid crystal polymer can be analyzed by a combination of nuclear magnetic resonance spectrometry (NMR) with at least one of pyrolysis gas chromatography mass spectroscopy (Py-GC-MS) and matrix assisted laser desorption/ionization time-of-flight mass spectrometry (MALDI-TOFMS). It can be checked by Py-GC-MS or MALDI-TOFMS whether or not a polymer includes two or more kinds of constitutional units different from each other in carbon atom number of the linking group.

B. Liquid Crystal Composition

A liquid crystal composition in the present disclosure is a liquid crystal composition including the side-chain liquid crystal polymer in the present disclosure, a polymerizable liquid crystal compound, and a photopolymerization initiator.

The liquid crystal composition in the present disclosure is easily homeotropically aligned. Thus, the composition can give a retardation layer which is excellent in in-plane uniformity of retardation value, and which is not easily broken and is strong against bending.

Operation for exhibiting such advantageous effect by the liquid crystal composition has not yet been partially made clear. However, it is presumed that the operation is as follows:

The liquid crystal composition in the present disclosure contains, as the side-chain liquid crystal polymer, the following two or more kinds of constitutional units represented by the general formula (I), besides a liquid crystal constituent unit: two or more kinds of constitutional units different from each other in carbon atom number of a linking group represented by —$(CH_2)_n$— or —$(C_2H_4O)_{n'}$—, that is, different from each other in length of the linking group.

When the liquid crystal composition containing the side-chain liquid crystal polymer is made into a coating film, it is presumed that each side chain of the side-chain liquid crystal polymer is aligned in a direction orthogonal to the in-plane direction of the coating film. As described above, the side-chain liquid crystal polymer in the present disclosure includes two or more kinds of constitutional units represented by the general formula (I) and different from each other in length; thus, over each short side chain of the polymer, a void is produced which is surrounded by each long side chain thereof. The polymerizable liquid crystal compound easily enters the void so that the liquid crystal compound is homeotropically aligned with ease. Moreover, the polymerizable liquid crystal compound that has been once homeotropically aligned is not easily moved. Such matters are presumed. From these matters, it is presumed that the liquid crystal composition in the present disclosure is homeotropically aligned with ease even at low temperatures and further the homeotropically aligned polymerizable liquid crystal compound is uniformly arranged.

Additionally, in the side-chain liquid crystal polymer in the present disclosure, the linking group represented by $L^1$ or $L^{1'}$, which the constitutional units represented by the general formula (I) contain, has a flexible structure; and further as described above, the polymer includes two or more constitutional units represented by the general formula (I) and different from each other in length so that the voids can easily be made. It is presumed that a synergetic effect of such a flexible structure and the voids at an appropriate level, causes the resultant retardation layer to be strong against bending, and not to be easily broken.

In this way, the liquid crystal composition in the present disclosure gives a retardation layer excellent in resistance to bending, and high in in-plane uniformity of retardation value. The retardation layer is preferably usable in, for example, a flexible display device in which a display section can be flexibly deformed. Furthermore, the liquid crystal composition in the present disclosure also produces an advantageous effect of widening a process margin since the polymerizable liquid crystal compound is easily homeotropically aligned at low temperatures.

The liquid crystal composition in the present disclosure includes at least a side-chain liquid crystal polymer, a polymerizable liquid crystal compound, and a photopolymerization initiator, and may further include a different component as far as the advantageous effects thereof are not impaired. Hereinafter, the individual components included in the liquid crystal composition will be described in turn.

<Side-Chain Liquid Crystal Polymer>

In the liquid crystal composition in the present disclosure, the side-chain liquid crystal polymer may be the same as described in item "A. Side-Chain Liquid Crystal Polymer". Thus, a description thereon is omitted herein.

In the liquid crystal composition in the present disclosure, one kind of the side-chain liquid crystal polymer may be singly used, or two or more kinds of such polymers may be used in combination. In the present embodiment, the content proportion of the side-chain liquid crystal polymer is preferably 3 parts or more and 80 parts or less, more preferably 5 parts or more and 70 parts or less, even more preferably 10 parts or more and 60 parts or less by mass for 100 parts by mass of solid components in the liquid crystal composition since a liquid crystal composition can be yielded about which the precipitation of liquid crystal is restrained and the temperature range in which liquid crystal is aligned can be widened.

Incidentally, the present disclosure, solid components denotes all components from which any solvent is removed. Examples thereof include the polymerizable liquid crystal compound, which will be detailed below, even when this compound is in a liquid form.

<Polymerizable Liquid Crystal Compound>

In one embodiment in the present disclosure, the polymerizable liquid crystal compound may be any one selected appropriately from polymerizable liquid crystal compounds known in the prior art. In the present embodiment, the polymerizable liquid crystal compound is preferably a polymerizable liquid crystal compound containing a polymerizable group at least at one terminal of its mesogen, and is more preferably a polymerizable liquid crystal compound containing polymerizable groups at both terminals of its mesogen respectively, from the viewpoint of the homeotropic alignment property and the endurance of the resultant retardation layer in a combination of the side-chain liquid crystal polymer with the compound.

The mesogen, which the polymerizable liquid crystal compound contains, may be the same mesogen that the liquid crystal constitutional unit contains in the above-mentioned side-chain liquid crystal polymer.

As the polymerizable group which the polymerizable liquid crystal compound contains, examples include cyclic-ether-containing groups, such as an oxirane ring, and an oxetane ring, and ethylenic-double-bond-containing groups. Out of these examples, ethylenic-double-bond-containing groups are preferred since the liquid crystal compound shows light curability and are excellent in handleability. Examples of the ethylenic-double-bond-containing groups include vinyl, allyl, and (meth)acryloyl groups. Out of these examples, a (meth)acryloyl group is preferred.

In the present embodiment, the polymerizable liquid crystal compound is preferably one or more compounds selected from compounds each represented by the following general formula (III) and compounds each represented by the following general formula (IV) from the viewpoint of the homeotropic alignment property:

[Chem. 7]

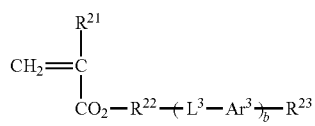

General Formula (III)

where $R^{21}$ represents a hydrogen atom or a methyl group, and $R^{22}$ represents a group represented by —$(CH_2)_p$—, or —$(C_2H_4O)_{p'}$—. $L^3$ represents a direct bond or a linking group represented by —O—, —O—C(=O)—, or —C(=O)—O—, and $Ar^3$ represents an arylene group containing 6 or more and 10 or less carbon atoms and optionally containing a substituent. Plural $L^3$s, as well as plural $Ar^3$s, may be the same or different from each other. $R^{23}$ represents —F, —Cl, —CN, —$OCF_3$, —$OCF_2H$, —NCO, —NCS, —$NO_2$, —NHC(=O)—$R^{24}$, —C(=O)—$OR^{24}$, —OH, —SH, —CHO, —$SO_3H$, —$NR^{24}{}_2$, —$R^{25}$, or —$OR^{25}$. $R^{24}$ represents a hydrogen atom, or an alkyl group containing 1 or more and 6 or less carbon atoms, and $R^{25}$ represents an alkyl group containing 1 or more and 6 or less carbon atoms. b is an integer of 2 or more and 4 or less, and p and p' are each independently an integer of 2 or more and 10 or less.

[Chem. 8]

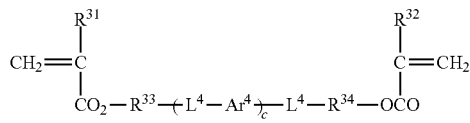

General Formula (IV)

where $R^{31}$ and $R^{32}$ each independently represent a hydrogen atom, or a methyl group, and $R^{33}$ represents a group represented by —$(CH_2)_q$—, or —$(C_2H_4O)_{q'}$—, and $R^{34}$ represents a group represented by —$(CH_2)_r$— or —$(OC_2H_4)_{r'}$—. $L^4$ represents a direction bond or a linking group represented by —O—, —O—C(=O)—, or —C(=O)—O—, and $Ar^4$ represents an arylene group containing 6 or more and 10 or less carbon atoms and optionally containing a substituent, and plural $L^4$s, as well as $Ar^4$s, may be the same as or different from each other. c is an integer of 2 or more and 4 or less, and q, q', r and r' are each independently an integer of 2 or more and 10 or less.

p and p' in the general formula (III), and q, q', r and r' in the general formula (IV) are each preferably 2 or more and 8 or less, more preferably 2 or more and 6 or less, even more preferably 2 or more and 5 or less from the viewpoint of the homeotropic alignment property.

$L^3$ and $L^4$ may each be any one of the same groups as for $L^2$ in the general formula (II).

$Ar^3$ and $Ar^4$ may each be any one of the same groups as for $Ar^2$ in the general formula (II).

The mesogen structure contained in the polymerizable liquid crystal compound is preferably a partial structure represented by each of chemical formulae (V-1) to (V-4) illustrated below, and is in particular preferably a partial structure represented by at least one selected from the group consisting of the chemical formulae (V-1), (V-2) and (V-4) each containing three or more cyclic structures. Any hydrogen atom in a phenylene group or naphthylene group in the partial structure represented by each of the chemical formulae (V-1) to (V-4) may be substituted with an alkyl group containing 1 or more and 3 or less carbon atoms, or a halogen atom.

[Chem. 9]

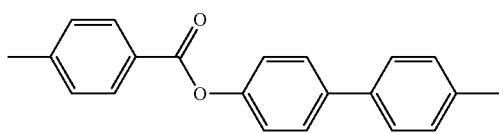

(V-1)

(V-2)
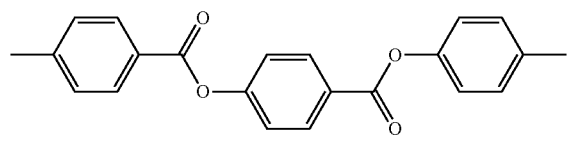
(V-4)
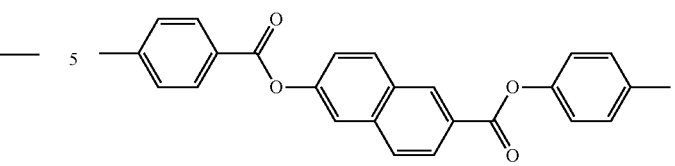
(V-3)
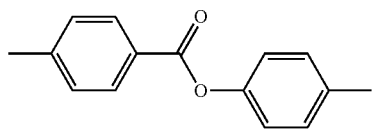
Preferred and specific examples of the compound represented by the general formula (III) and the compound represented by the general formula (IV) include compounds represented by chemical formulae (1) to (17) illustrated below, respectively. However, the compounds are not limited to these examples.
[Chem. 10]
(1)
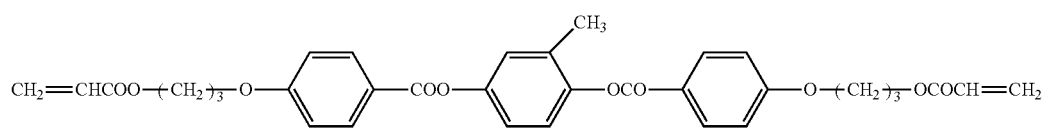
(2)
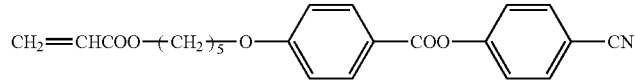
(3)
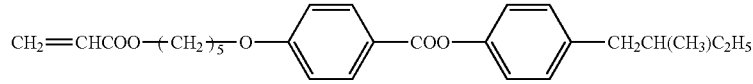
(4)
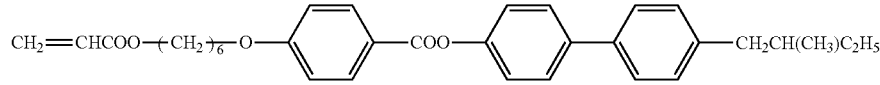
(5)
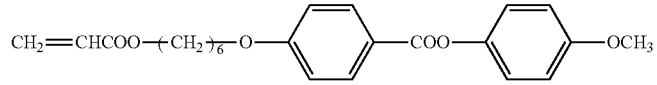
(6)
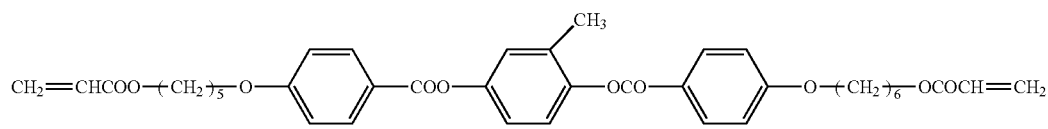
(7)
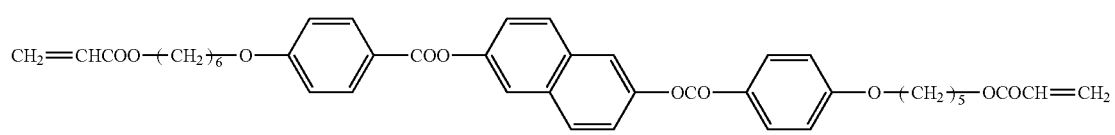
(8)
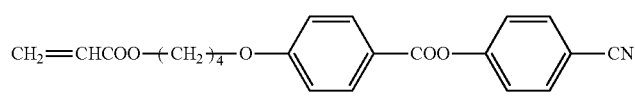
(9)
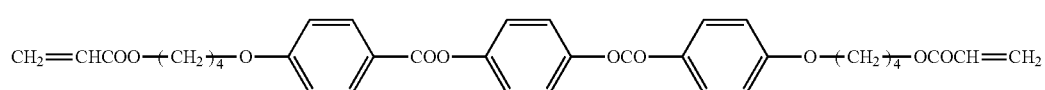
(10)

-continued

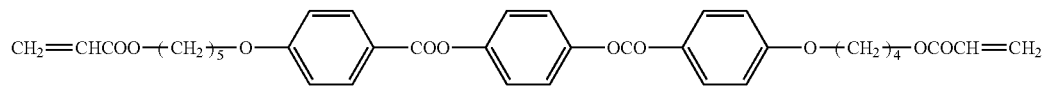
(11)

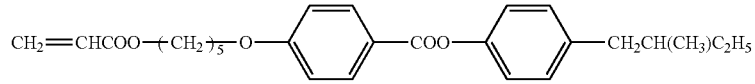
(12)

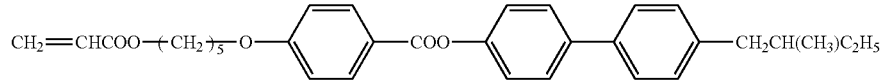
(13)

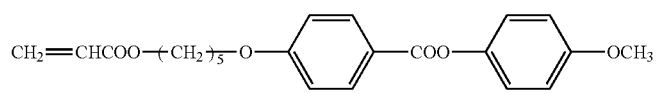
(14)

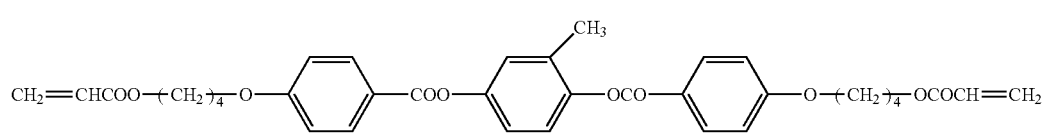
(15)

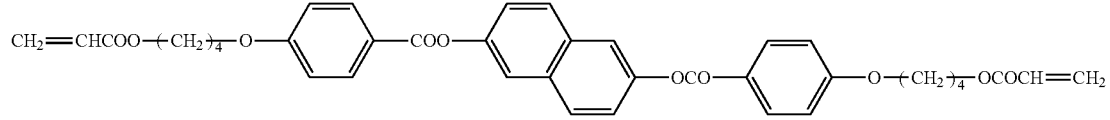
(16)

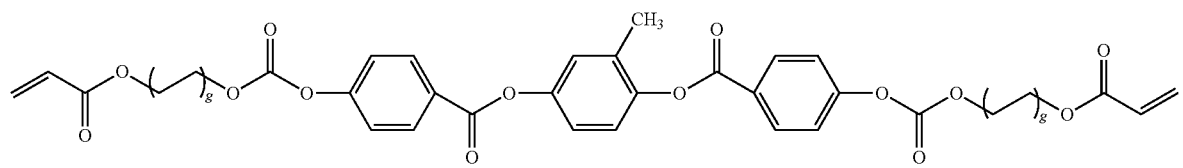
(17)

g is an integer of 2 or more and 5 or less

In the present embodiment, one kind of the polymerizable liquid crystal compound may be singly used, or two or more kinds of such compounds may be used in combination.

In the present embodiment, the content proportion of the polymerizable liquid crystal compound is preferably 20 parts or more and 95 parts or less, more preferably 30 parts or more and 90 parts or less, even more preferably 40 parts or more and 90 parts or less by mass for 100 parts by mass of solid components in the liquid crystal composition to improve the resultant retardation layer in resistance to bending, and make the layer excellent in in-plane uniformity of retardation value.

<Photopolymerization Initiator>

In the present embodiment, the photopolymerization initiator may be appropriately selected from photopolymerization initiators known in the prior art. Specific and preferred examples of the photopolymerization initiator include aromatic ketones including thioxanthone, α-aminoalkylphenones, α-hydroxyketones, acylphosphine oxides, oxime esters, aromatic onium salts, organic peroxides, thio compounds, hexaaryl biimidazole compounds, ketoxime ester compounds, borate compounds, azinium compounds, metallocene compounds, active ester compounds, compounds each containing a carbon-halogen bond, and alkylamine compounds. Out of these examples, at least one from the following is preferred: acylphosphine oxide based polymerization initiators, α-aminoalkylphenone based polymerization initiators, α-hydroxyketone based polymerization initiators, and oxime ester based polymerization initiators.

Examples of the acylphosphine oxide based polymerization initiators include bis(2,4,6-trimethylbenzoyl)-phenyl-phosphine oxide (for example, trade name: IRGACURE 819, manufactured by BASF Corp.), bis(2,6-dimethoxybenzoyl)-2,4,4-trimethyl-pentylphenylphosphine oxide, and 2,4,6-trimethylbenzoyl-diphenyl-phosphine oxide (trade name: Lucirin TPO, manufactured by BASF Corp., and others).

Examples of the α-aminoalkylphenone based polymerization initiators include 2-methyl-1-(4-methylthiophenyl)-2-morpholinopropane-1-one (for example, IRGACURE 907, manufactured by BASF Corp.), 2-benzyl-2-(dimethylamino)-1-(4-morpholinophenyl)-1-butanone (for example, IRGACURE 369, manufactured by BASF Corp.), and 2-(dimethylamino)-2-[(4-methylphenyl)methyl]-1-[4-(4-morpholinyl)phenyl]-1-butanone (IRGACURE 379EG, manufactured by BASF Corp.).

Examples of the α-hydroxyketone based polymerization initiators include 2-hydroxy-1-{4-[4-(2-hydroxy-2-methyl-propionyl)-benzyl]-phenyl}-2-methyl-propane-1-one (for example, trade name: IRGACURE 127, manufactured by BASF Corp., and others), 2-hydroxy-4'-hydroxyethoxy-2-methyl propiophenone (for example, trade name: IRGACURE 2959, manufactured by BASF Corp., and others), 1-hydroxy-cyclohexyl-phenyl-ketone (for example, trade name: IRGACURE 184, manufactured by BASF Corp., and others), and oligo{2-hydroxy-2-methyl-1-[4-(l-methylvinyl)phenyl]propanone} (for example, trade name: ESACURE ONE, manufactured by Lamberti Inc., and others).

Examples of the oxime ester based polymerization initiators include 1,2-octanedione, 1-[4-(phenylthio)-,2-(O-benzoyloxime)] (trade name: IRGACURE OXE-01, manufactured by BASF Corp.), ethanone, 1-[9-ethyl-6-(2-methylbenzoyl)-9H-carbazol-3-yl]-,1-(o-acetyloxime) (trade name: IRGACURE OXE-02, manufactured by BASF Corp.), methanone, ethanone, 1-[9-ethyl-6-(1,3-dioxolane, and 4-(2-methoxyphenoxy)-9H-carbazol-3-yl]-,1-(o-acetyloxime) (trade name: ADEKA OPT-N-1919, manufactured by Adeka Corp.).

In the present embodiment, one kind of the photopolymerization initiator may be singly used, or two or more kinds of such initiators may be used in combination.

In the embodiment, the content proportion of the photopolymerization initiator is preferably 0.1 parts or more and 10 parts or less, more preferably 1 part or more and 8 parts or less by mass for 100 parts by mass of solid components in the liquid crystal composition to promote the curing of the polymerizable liquid crystal compound.

<Other Components>

The liquid crystal composition of the present embodiment may include any other component as far as advantageous effects thereof are not impaired. Specifically, the composition may include, as the other component, for example, a levelling agent, a polymerization inhibitor, an antioxidant or a light stabilizer, or a solvent from the viewpoint of the coatability of the composition. These components may each be any one selected appropriately from materials known in the prior art.

The levelling agent is preferably a fluorine type or a silicone type levelling agent. Specific examples of the levelling agent include MEGAFACE series manufactured by DIC Corp. and described in JP 2010-122325A, TSF series manufactured by Momentive Performance Materials Japan Inc., and FTERGENT series manufactured by Neos Co., Ltd. When the levelling agent is used in the present embodiment, the content proportion thereof is preferably set to an amount of 0.001 parts or more and 5 parts or less by mass for 100 parts by mass of solid components in the liquid crystal composition.

The liquid crystal composition of the present embodiment optionally includes a solvent from the viewpoint of the coatability thereof. The solvent is sufficient to be selected appropriately from solvents known in the prior art in each of which the individual components included in the liquid crystal composition can be dissolved or dispersed. Specific examples thereof include hexane, cyclohexane, and other hydrocarbon solvents; methyl ethyl ketone, methyl isobutyl ketone, cyclohexanone, and other ketone solvents; tetrahydrofuran, propylene glycol monoethyl ether (PGME), and other ether solvents; chloroform, dichloromethane, and other halogenated alkyl solvents; ethyl acetate, propylene glycol monomethyl ether acetate, and other ester solvents; N, N-dimethylformamide, and other amide solvents; dimethylsulfoxide, and other sulfoxide solvents; and methanol, ethanol, propanol, and other alcohol solvents. In the present embodiment, one kind of solvent may be singly used, or two or more kinds of solvents may be used in combination.

The liquid crystal composition of the present embodiment is suitable for producing a liquid crystal alignment membrane. The side-chain liquid crystal polymer is homeotropically aligned with ease; and the polymerizable liquid crystal compound is homeotropically aligned with ease accordingly. Thus, the liquid crystal composition is suitable for producing a positive C type retardation layer.

C. Retardation Film

The retardation film in the present disclosure is a retardation film including a retardation layer in which the retardation layer contains a cured product of a liquid crystal composition containing the side-chain liquid crystal polymer in the present disclosure and a polymerizable liquid crystal compound.

Incidentally, although the retardation layer is typically made of the cured product of the liquid crystal composition, the retardation layer may include any other constituent as far as the advantageous effects of the present embodiment are not impaired.

Furthermore, the retardation film using the side-chain liquid crystal polymer in the present disclosure may be a retardation film including a retardation layer containing the side-chain liquid crystal polymer in the present disclosure.

The retardation film in an embodiment in the present disclosure is a film in which a retardation layer contains a cured product of the liquid crystal composition of the present embodiment, or at least the side-chain liquid crystal polymer in the present disclosure; thus, the retardation film is characterized by being high in in-plane uniformity of retardation value to be excellent in optical properties, and being further flexible not to be easily broken.

Hereinafter, a description will be made about the structure of such a retardation film.

Figure 2:
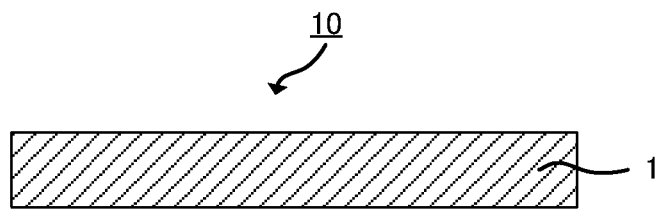
FIG. 2 is a schematic sectional view showing an embodiment of a retardation film.
Figure 3:
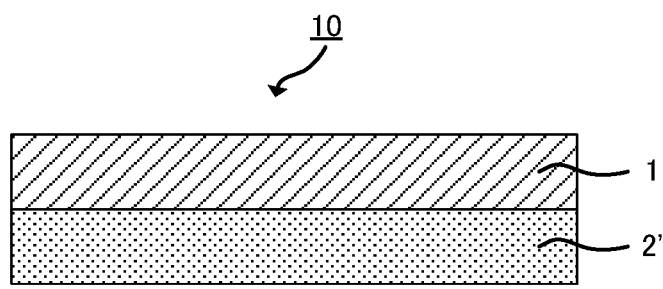
FIG. 3 is a schematic sectional view showing an embodiment of a retardation film.

With reference to the drawings, the layer structure of the retardation film will be described. FIGS. 1 to 3 each show one embodiment of the retardation film in the present disclosure. The one embodiment illustrated in FIG. 1, which is a retardation film 10, is a retardation film in which an alignment membrane 3, and a retardation layer 1 are laminated in this order on a substrate 2. The one embodiment illustrated in FIG. 2, which is a retardation film 10, is a retardation film made only of a retardation layer 1. In the one embodiment illustrated in FIG. 3, which is a retardation film 10, a retardation layer 1 is directly formed on a substrate 2'. In the retardation film illustrated in FIG. 3, a means for expressing alignment-regulating force may be given to the surface of the substrate 2' on the retardation-layer-1-side.

Incidentally, as described above, in the liquid crystal composition, which contains a side-chain liquid crystal polymer containing constitutional units represented by the general formula (I) and a liquid crystal constitutional unit, and further contains a polymerizable liquid crystal compound, the side-chain liquid crystal polymer is homeotropically aligned with ease, and the polymerizable liquid crystal compound is homeotropically aligned with ease accordingly. Thus, even when no alignment membrane is used, each of the retardation films can show homeotropic alignment property.

1. Retardation Layer

The retardation layer 1 of an embodiment in the present disclosure contains a cured product of a liquid crystal composition containing the side-chain liquid crystal polymer in the present disclosure and a polymerizable liquid crystal compound; or contains at least the side-chain liquid crystal polymer in the present disclosure.

The side-chain liquid crystal polymer in the present disclosure, and the polymerizable liquid crystal compound may each be the same as described about the liquid crystal composition of the embodiment in the present disclosure. Thus, any description thereabout is omitted herein.

The retardation layer is preferably a retardation layer in which the liquid crystal constitutional unit of the side-chain liquid crystal polymer, and the polymerizable liquid crystal compound are cured in the state of being homeotropically aligned. The cured product of the liquid crystal composition of the embodiment in the present disclosure contains a structure yielded by polymerizing polymerizable groups of the polymerizable liquid crystal compound at least partially. Since the cured product contains this structure, which is yielded by polymerizing the polymerizable groups of the polymerizable liquid crystal compound at least partially, the retardation layer of the embodiment is a retardation layer improved in endurance.

Incidentally, the liquid crystal constitutional unit included in the retardation layer can be identified by one or more methods out of known methods by which molecular structure information pieces can be gained, such as a nuclear magnetic resonance method (NMR), infrared spectroscopy (IR), gas chromatogram mass spectroscopy (GC-MS), X-ray photoelectron spectroscopy (XPS), and time-of-flight secondary ion mass spectroscopy (TOF-SIMS).

Moreover, it can be verified that the polymerizable liquid crystal compound is homeotropically aligned by measuring the retardation thereof, using an automatically birefringence measuring instrument (for example, trade name: KOBRA-WR, manufactured by Oji Scientific Instruments Co., Ltd.).

The retardation can be measured, using an automatically birefringence measuring instrument (for example, trade name: KOBRA-WR, manufactured by Oji Scientific Instruments Co., Ltd.). Measuring-light is radiated into the retardation layer perpendicularly or obliquely to a surface of this layer. From a chart of the optical retardation of the retardation layer and the incident angle of the measuring-light, verification can be attained about the anisotropy of increasing the retardation of the retardation layer.

By collecting a material from the retardation layer, and then analyzing the material, it can be verified that the retardation layer includes the side-chain liquid crystal polymer included in the liquid crystal composition of the embodiment in the present disclosure, and the structure yielded by polymerizing the polymerizable groups of the polymerizable liquid crystal compound at least partially. A method for the analysis can make use of NMR, IR, GC-MS, XPS and TOF-SIMS, and a combination of two or more of these methods.

The retardation layer may include a photopolymerization initiator, a levelling agent, a polymerization inhibitor, an antioxidant, a light stabilizer, and other components. The retardation layer may not include the photopolymerization initiator, or some other component that may be wholly decomposed when light radiation is performed to cause a reaction of the polymerizable groups of the polymerizable liquid crystal compound.

The thickness of the retardation layer may be appropriately set in accordance with the use purpose thereof. In particular, the thickness is preferably in the range of 0.1 μm or more and 5 μm or less, more preferably in the range of 0.5 μm or more and 3 μm or less.

2. Alignment Membrane

In the present document DESCRIPTION, an alignment membrane is a layer for arranging a liquid crystal component included in a retardation layer into a predetermined direction.

The alignment membrane used in the embodiment in the present disclosure is preferably a homeotropic alignment membrane since the liquid crystal composition of the embodiment in the present disclosure is homeotropically aligned with ease.

The homeotropic alignment membrane is an alignment membrane having a function of aligning the long axis of a mesogen of the liquid crystal component included in the retardation layer homeotropically by laying this membrane as a coating membrane.

The homeotropic alignment membrane is an alignment membrane having alignment-regulating force in the perpendicular direction to the membrane, and may be any one of various homeotropic alignment membranes each supplied to produce a C plate, and various homeotropic alignment membranes which are each applied to a VA liquid crystal display device and other devices. The homeotropic alignment membrane may be for example, a polyimide alignment membrane, or an alignment membrane based on an LB membrane. Specific examples of a constituting material of the alignment membrane include lectin; silane surfactants; titanate surfactants; pyridinium salt polymeric surfactants; silane coupling type compositions, for homeotropic alignment membranes, containing, for example, n-octadecyltriethoxysilane; and polyimide type compositions, for homeotropic alignment membranes, containing, for example, a soluble polyimide containing, at its side chains, long-chain alkyl groups or alicyclic structures, or a polyamic acid containing, at its side chains, long-chain alkyl groups or alicyclic structures.

Incidentally, it is allowable to use, as a composition for homeotropic alignment membranes, a commercially available product, such as a polyimide composition for homeotropic alignment membranes, "JALS-2021", or "JALS-204" manufactured by JSR Corp.; or a product "RN-1517", "SE-1211" or "EXPOA-018" manufactured by Nissan Chemical Corp. The homeotropic alignment membrane may also be a homeotropic alignment membrane described in JP 2015-191143 A.

The method for forming the alignment membrane is not particularly limited. The alignment membrane can be formed, for example, by applying a composition for alignment membranes that will be detailed later onto a substrate that will be detailed later, and giving alignment-regulating force thereto. The means for giving alignment-regulating force to the alignment membrane may be any means known in the prior art.

The thickness of the alignment membrane is not particularly limited as long as the alignment membrane makes it possible to arrange a liquid crystal component in the retardation layer in a predetermined direction, and may be appropriately set. The thickness of the alignment membrane is usually in the rage of 1 nm or more and 10 μm or less, preferably in the rage of 60 nm or more and 5 μm or less.

3. Substrate

In the present embodiment, examples of the substrate include a glass substrate, a metallic substrate, and a resin substrate. In particular, the substrate preferably has transparency, and is appropriately selectable from transparent substrates known in the prior art. The transparent substrate may be, besides the glass substrate, a transparent resin substrate formed, using a resin such as an acetylcellulose resin such as triacetylcellulose, a polyester resin such as polyethylene terephthalate, polyethylene naphthalate, polybutylene terephthalate or polylactic acid, an olefin based resin such as polypropylene, polyethylene or polymethylpentene, acrylic resin, polyurethane resin, polyethersulfone, polycarbonate, polysulfone, polyether, polyetherketone, acrylonitrile, methacrylonitrile, cycloolefin polymer, or cycloolefin copolymer.

The transmittance of the transparent substrate is preferably 80% or more, more preferably 90% or more in a visible ray band. The transmittance of the transparent substrate is measurable in accordance with JIS K7361-1 (Test Method for Total Light Transmittance of Plastic-Transparent Material).

When the retardation layer is formed in a roll-to-roll manner, the transparent substrate is preferably made of a flexible material having a flexibility permitting the substrate to be wound into a roll form.

Examples of the flexible material include cellulose derivatives, norbornene-based polymers, cycloolefin polymers, polymethyl methacrylate, polyvinyl alcohol, polyimide, polyarylate, polyethylene terephthalate, polysulfone, polyethersulfone, amorphous polyolefin, modified acrylic polymers, polystyrene, epoxy resins, polycarbonate, and polyesters. It is in particular preferred in the present embodiment to use a cellulose derivative or polyethylene terephthalate. This is because cellulose derivatives are especially excellent in optical isotropy, so that the substrate can be made excellent in optical properties. Moreover, polyethylene terephthalate is high in transparency and excellent in mechanical properties to be preferred.

The thickness of the substrate used in the embodiment is not particularly limited as far as the thickness is in a range making it possible to give a required self-supporting performance to the substrate in accordance with the use purpose of the retardation film, and other factors. The thickness is usually in the range of about 10 µm or more and 200 µm or less.

In particular, the thickness of the substrate is preferably in the range of 25 µm or more and 125 µm or less, especially preferably in the range of 30 µm or more and 100 µm or less. If the thickness is larger than in the former range, the following may be caused, for example, at the time of forming a long retardation film and subsequently cutting the film to be made into retardation film pieces: erosion products are increased or the cutting edge is worn away earlier than usual.

The structure of the substrate used in the embodiment is not limited to a structure made of a single layer. Thus, the structure may be a structure composed of layers laminated onto each other. When the substrate has the structure composed of layers laminated onto each other, the layers which are layers having the same composition, or layers having compositions different from each other may be laminated.

When the alignment membrane used in the embodiment is a membrane containing an ultraviolet curable resin, a primer layer may be formed on the substrate to improve adhesion between the transparent substrate and the ultraviolet curable resin. This primer layer may be any as long as it has adhesion to both of the substrate and the ultraviolet curable resin, and is visible-ray-optically transparent to transmit ultraviolet rays. This layer can make use of, for example, a material selected appropriately from vinyl-chloride/vinyl-acetate copolymer based and urethane based materials, and others.

When no homeotropic alignment membrane is laid, an anchor coat layer may be laminated onto the substrate. The anchor coat layer can improve the substrate in strength, and cause the retardation layer to keep a good homeotropic alignment. The material of the anchor coat layer may be a metal alkoxide, in particular, a metal silicon alkoxide sol. The metal alkoxide is usually used in the form of a solution in an alcohol. The anchor coat layer needs to be an even and flexible membrane. Thus, the thickness of the anchor coat layer is preferably about 0.04 µm or more and 2 µm or less, more preferably about 0.05 µm or more and 0.2 µm or less.

When the substrate contains the anchor coat layer, the substrate and the anchor coat layer may be improved in close adhesion between the two by laminating a binder layer into between the substrate and the anchor coat layer, or by incorporating, into the anchor coat layer, a material for enhancement of close adhesion with the substrate. A binder material used to form the binder layer is usable without any especial restriction as far as the material is a material that can improve the close adhesion between the substrate and the anchor coat layer. Examples of the binder material include silane coupling agents, titanium coupling agents, and zirconium coupling agents.

4. Usage

The retardation film in the present disclosure is favorably used as a retardation film containing a positive C type retardation layer. The retardation film in the present disclosure is favorably used as, for example, a viewing-angle compensation film, and is favorably used for an optical member for various display devices that will be detailed later.

D. Method for Producing Retardation Film

A method of an embodiment in the present disclosure for producing a retardation film is, for example, a producing method in which a retardation layer is formed by:

a step of forming, into a film, the liquid crystal composition of the embodiment in the present disclosure, a step of aligning the liquid crystal constitutional unit of the side-chain liquid crystal polymer and the polymerizable liquid crystal compound in the liquid crystal composition formed into the film, and a step of polymerizing the polymerizable liquid crystal compound after the aligning step.

The liquid crystal composition may be the same as described in the item "B. Liquid Crystal Composition". Thus, any description thereabout is omitted herein.

(1) Step of Forming Liquid Crystal Composition into Film

The liquid crystal composition is applied uniformly onto a support to form a film.

"Onto a support" may be "on the above-defined substrate", or may be, when the substrate contains the alignment membrane, "on the alignment membrane of the substrate".

The method for coating is not particularly limited as long as it is a method capable of forming a film having a desired thickness with a good precision, and may be appropriately selected. Examples thereof include gravure coating, reverse coating, knife coating, dip coating, spray coating, air knife coating, spin coating, roll coating, printing, dip pulling-up, curtain coating, die coating, casting, bar coating, extrusion coating, and E type coating methods.

(2) Step of Aligning Liquid Crystal Component

Next, the liquid crystal constitutional unit of the side-chain liquid crystal polymer and the polymerizable liquid crystal compound in the liquid crystal composition made into the film are adjusted into a temperature at which these two can be homeotropically aligned, so as to be heated. This heating treatment makes it possible to align the liquid crystal constitutional unit of the side-chain liquid crystal polymer, and the polymerizable liquid crystal compound, and then dried, and to fix the unit and the compound while keeping the alignment state.

The temperature, at which the two can be homeotropically aligned, is varied in accordance with individual substances in the liquid crystal composition; thus, a temperature therefor needs to be appropriately adjusted. The heating treatment is conducted, for example, preferably at 40° C. or more and 200° C. or less, more preferably at 40° C. or more and 100° C. or less. The liquid crystal composition of the embodiment contains the above-defined side-chain liquid crystal polymer so that the composition can be homeotropically aligned in a wide temperature range. Thus, the temperature control is easy.

The heating means is appropriately selectable from known heating and drying means to be usable.

Moreover, the heating period may be appropriately selected, for example, from periods in the range of 10 seconds or more and 2 hours or less, preferably in the range of 20 seconds or more and 30 minutes or less.

(3) Step of Polymerizing Polymerizable Liquid Crystal Compound

The polymerizable liquid crystal compound can be polymerized by, for example, light irradiation to the coating film fixed in the state that the alignment state of the liquid crystal component is maintained in the aligning step. Thus, a retardation layer containing a cured product of the liquid crystal composition can be gained.

The light irradiation is preferably ultraviolet-ray irradiation. For the ultraviolet-ray irradiation, ultraviolet rays are used which are emitted from light rays of, for example, an ultra-high pressure mercury lamp, a high pressure mercury lamp, a low pressure mercury lamp, a carbon arc, a xenon arc, or a metal halide lamp. The irradiance of the energy beam source may be appropriately selected. Preferably, the accumulated irradiation dose thereof at an ultraviolet wavelength of 365 nm is, for example, in the range of 10 mJ/cm$^2$ or more and 10000 mJ/cm$^2$ or less.

E. Transfer Laminate

A transfer laminate configured to transfer a retardation layer, in which the transfer laminate includes a retardation layer and a support supporting the retardation layer in a removable manner, and in which the retardation layer contains a cured product of a liquid crystal composition containing the side-chain liquid crystal polymer in the present disclosure, and a polymerizable liquid crystal compound.

Incidentally, although the retardation layer is typically made of the cured product of the liquid crystal composition, the retardation layer may include any other constituent as far as the advantageous effects of the present embodiment are not impaired.

Furthermore, a transfer laminate using the side-chain liquid crystal polymer in the present disclosure, may be a transfer laminate configured to transfer a retardation layer, in which the transfer laminate includes a retardation layer and a support supporting the retardation layer in a removable manner, in which the retardation layer includes the side-chain liquid crystal polymer in the present disclosure.

The transfer laminate of the present embodiment is a laminate containing a retardation layer containing a cured product of the above-mentioned liquid crystal composition, or containing at least the side-chain liquid crystal polymer in the present disclosure; thus, the transfer laminate is a laminate containing a retardation layer excellent in resistance to bending and high in in-plane uniformity of retardation value. Moreover, the polymerizable liquid crystal compound is homeotropically aligned with ease even at a low temperature; thus, such transfer laminates are wide in process margin, and are improved in mass-productivity. The transfer laminate of the present embodiment makes it possible to transfer, onto, for example, any other optical member, the retardation layer in the present disclosure which is, for example, a thin membrane including no substrate.

Figure 5:
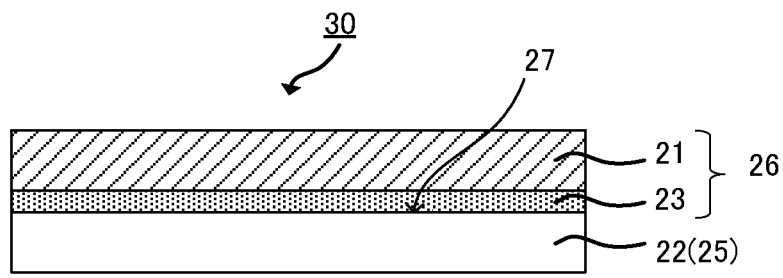
FIG. 5 is a schematic sectional view showing an embodiment of a transfer laminate.

The transfer laminate of the present embodiment makes it possible to provide, for example, the retardation film 10 which has been illustrated in FIG. 2, which is made only of the retardation layer 1, or a retardation film illustrated in FIG. 5, which includes no substrate and is made only of a laminate 26 in which an alignment membrane 23 and a retardation layer 21 are laminated onto each other. In other words, as far as the retardation layer is at least peelable and removable, an alignment membrane and others may be laminated on the retardation layer, which is supplied to be transferred from the transfer laminate.

Hereinafter, a description will be made about the structure of such a transfer laminate. However, the liquid crystal composition of the embodiment in the present disclosure has been described above; thus, any description thereabout is omitted herein.

Figure 4:
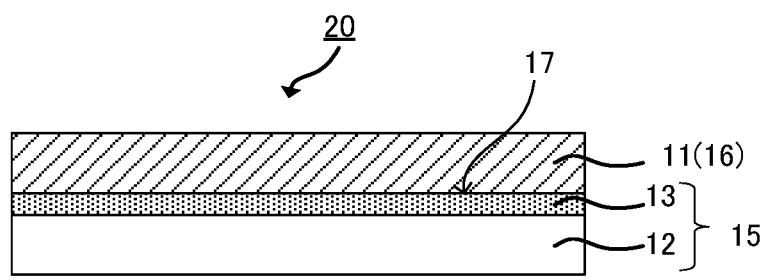
FIG. 4 is a schematic sectional view showing an embodiment of a transfer laminate.

The layer structure of the transfer laminate will be described with reference to the drawings. FIGS. 4 and 5 each show one embodiment of the transfer laminate in the present disclosure.

The one embodiment illustrated in FIG. 4, which is a transfer laminate 20, is a transfer laminate in which as a retardation layer 16 supplied to be transferred, and a support 15 supporting the retardation layer in a removable manner, an alignment membrane 13 and a retardation layer 11 are laminated in this order onto a second substrate 12. In the transfer laminate illustrated in FIG. 4, the peel strength between the second substrate 12 and the alignment membrane 13 is larger than the peel strength between the alignment membrane 13 and the retardation layer 11. In this way, the transfer laminate illustrated in FIG. 4 is an example in which a peel is attained at an interface 17 between the alignment membrane and the retardation layer so that the retardation layer 11 (16) can be transferred.

The one embodiment shown in FIG. 5, which is a transfer laminate 30, is a transfer laminate in which as a retardation layer 26 supplied to be transferred, and a support 25 supporting the retardation layer in a removable manner, an alignment membrane 23 and a retardation layer 21 are laminated in this order onto a second substrate 22. In the transfer laminate illustrated in FIG. 5, the peel strength between the second substrate 22 and the alignment membrane 23 is smaller than the peel strength between the alignment membrane 23 and the retardation layer 21. In this way, the transfer laminate illustrated in FIG. 5 is an example in which a peel is attained at an interface 27 between the second substrate 22 and the alignment membrane 23 so that, as the retardation layer 26 supplied to be transferred, the retardation layer 21 and the alignment membrane 23 can be transferred.

For example, whether the peel strength between the second substrate and the alignment membrane is larger or smaller than the peel strength between the alignment membrane and the retardation layer can be checked by peeling the retardation layer and then checking at which of the two interfaces the peel is made. The checking at which of the two interfaces the peel is made can be analyzed by, for example, IR.

Figure 6:
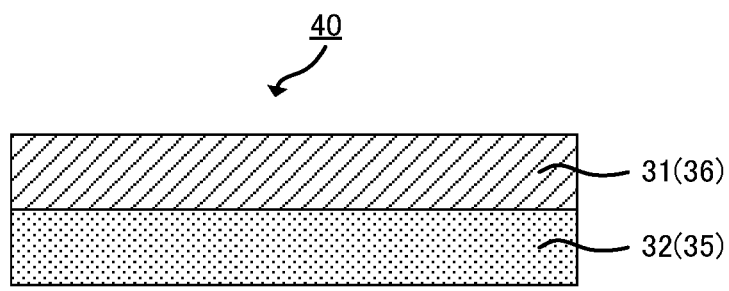
FIG. 6 is a schematic sectional view showing an embodiment of a transfer laminate.

The one embodiment shown in FIG. 6, which is a transfer laminate 40, is a transfer laminate in which as a retardation layer 36 supplied to be transferred, and a support 35 supporting the retardation layer in a removable manner, a retardation layer 31 is laminated in this order onto a second substrate 32.

Hereinafter, each of the embodiments will be described. Its retardation layer may be the same retardation layer as described in the item "C. Retardation Film". Thus, any description thereabout is omitted herein.

Moreover, its alignment membrane and its substrate may be the same alignment membrane and substrate as described in the item "C. Retardation Film". Examples of the method for adjusting any one of the peel strengths in the embodiment include methods described below.

In order to make the peel strength between the second substrate 12 and the alignment membrane 13 larger than the peel strength between the alignment membrane 13 and the retardation layer 11 to gain the transfer laminate 20 illustrated in FIG. 4, for example, a method is usable in which a solvent contained in a composition for forming the alignment membrane is rendered a solvent in which the second substrate can be dissolved. The second substrate is preferably a resin substrate. Surface treatment may be applied to surfaces of the substrate to improve the substrate in adhesion. In such a case, close adhesion between the resin substrate and the alignment membrane can be improved.

Moreover, in order to make the peel strength between the alignment membrane and the retardation layer small to make the peel strength between the substrate and the alignment membrane larger than the peel strength between the alignment membrane and the retardation layer, the solvent resistance of the alignment membrane is preferably made relatively high. In a case where the alignment membrane is relatively high in solvent resistance, the alignment membrane is not easily dissolved in the solvent in the liquid crystal composition when the liquid crystal composition is applied onto the alignment membrane to form the retardation layer. Consequently, the close adhesion between the alignment membrane and the retardation layer can be lowered.

In order to make the peel strength between the second substrate 22 and the alignment membrane 23 smaller than the peel strength between the alignment membrane 23 and the retardation layer 21 to gain the transfer laminate 30 illustrated in FIG. 5, for example, a release treatment may be applied onto a surface of the substrate, or a release layer may be formed thereonto. This way makes it possible to heighten the substrate in peelability, and make the peel strength between the substrate and the alignment layer smaller than the peel strength between the alignment layer and the retardation layer.

Examples of the release treatment include fluorine treatment, silicone treatment, and other surface treatments.

Examples of the material of the release layer include fluorine-containing release agents, silicone type release agents, and wax type release agents. The method for forming the release layer is, for example, a method of coating a release agent by dip coating, spray coating, roll coating, or some other coating method.

Also in order to gain the transfer laminate 40 illustrated in FIG. 6, a release treatment may be applied onto a surface of the substrate, or a release layer may be formed thereonto, as required.

The substrate used in the transfer laminate may have flexibility or may not have flexibility. Preferably, the substrate has flexibility since the substrate is easily peeled to be removed.

When the substrate used in the transfer laminate is a sheet of any one of the above-mentioned materials, usually, the thickness of the substrate is preferably in the range of 20 µm or more and 200 µm or less from the viewpoint of the balance between a sufficient self-supporting performance of the substrate, and the flexibility thereof that permits the substrate to be adapted to the production of the transfer laminate in the present embodiment and the transfer step thereof.

A retardation layer that can be supplied from the transfer laminate in the present disclosure is favorably used for the same use purposes as that of the retardation film. The positive C-type retardation layer can be transferred to an optical member for various display devices. The retardation layer that can be supplied from the transfer laminate in the present disclosure is favorably used to supply a thin optical member.

F. Optical Member

An optical member in the present disclosure is an optical member containing the retardation film in the present disclosure and a polarizing plate disposed thereon.

Figure 7:
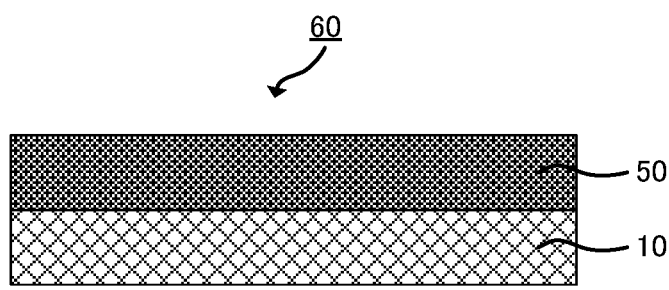
FIG. 7 is a schematic sectional view showing an embodiment of an optical member.

The optical member of the present embodiment will be described with reference to the drawings. FIG. 7 is a schematic sectional view showing an embodiment of the optical member.

In an example of an optical member 60 in FIG. 7, a polarizing plate 50 is located on a retardation film 10, which is the retardation film in the present disclosure. The optical member may optionally contain a pressure-sensitive-adhesive layer (adhesive layer) (not illustrated) between the retardation film 10 and the polarizing plate 50.

In the present embodiment, the polarizing plate is a plate-form member through which only a light ray vibrating in a specific direction is transmitted, and may be appropriately selected from polarizing plates known in the prior art. The polarizing plate is, for example, a polyvinyl alcohol film, a polyvinyl formal film, a polyvinyl acetal film, or an ethylene/vinyl-acetate copolymer saponified film, all of which have been dyed with iodine or a dye, and then stretched.

In the present embodiment, a pressure-sensitive-adhesive or adhesive for the pressure-sensitive-adhesive layer (adhesive layer) may be appropriately selected from such adhesives known in the prior art. Thus, a pressure-sensitive-adhesive or adhesive in any adhering form is usable, examples thereof including pressure-sensitive-adhesives, two-part curable adhesives, ultraviolet curable adhesives, thermally curable adhesives, and holt-melt adhesives.

The optical member of the present embodiment may further contain, besides the polarizing plate, a different layer which a known optical member contains. Examples of the different layer include retardation layers different from the retardation layer of the present embodiment, an antireflective layer, a diffusion layer, an antiglare layer, an antistatic layer, and a protective film. However, the different layer is not limited to these layers.

The optical member of the embodiment is usable as, for example, an optical member for restraining the reflection of external light. The optical member in the present disclosure, in which the retardation film in the present disclosure and a circularly polarizing plate are laminated onto each other, is favorably usable as, for example, an optical member for restraining external-light-reflection for a light emitting display device, and is also usable for a wide-viewing-angle polarizing plate for various display devices.

G. Method for Producing Optical Member

A method in the present disclosure for producing an optical member is not particularly limited, and may be appropriately selected for methods of laminating a polarizing plate onto the retardation film in the present disclosure. The method is, for example, a producing method of laminating a polarizing plate onto the retardation film in the present disclosure to interpose, therebetween, a pressure-sensitive-adhesive layer or adhesive layer.

A method of an embodiment in the present disclosure for producing an optical member is an optical member producing method including:

a transfer laminate preparing step of preparing the transfer laminate in the present disclosure, a transfer step in which a transfer receiving object including at least a polarization plate, is faced to the retardation layer of the transfer laminate, and the transfer laminate is transferred onto the transfer receiving object, and a removal step in which the support is removed from the transfer laminate transferred onto the transfer receiving object.

The optical member producing method of the embodiment in the present disclosure, using the above-defined transfer laminate, makes it possible to yield an optical member containing the polarizing plate, and only the retardation layer out of the retardation film in the present disclosure.

The transfer laminate used in the optical member producing method of the embodiment in the present disclosure may be the same as described in the item "E. Transfer laminate". Thus, any description thereabout is omitted herein.

The transfer receiving object used in the optical member producing method of the embodiment in the present disclosure is typically a transfer receiving object containing an adhesive layer and a polarizing plate. However, the transfer receiving object is not limited thereto. The transfer receiving object may further contain one or more of the same different layers as the optical member of the embodiment in the present disclosure may contain.

H. Display Device

A display device in the present disclosure includes the retardation film in the present disclosure, or an optical member containing the retardation film and a polarizing plate disposed thereon.

In other words, the display device in the present disclosure contains the retardation film in the present disclosure, or the optical member in the present disclosure.

Examples of the display device include light emitting display devices, and liquid crystal display devices. However, the display device is not limited to these examples.

The display device contains, particularly, the retardation film in the present disclosure or the optical member in the present disclosure; thus, in particular, the display device which is, for example, an organic light emitting display device containing a transparent electrode layer, a light emitting layer and an electrode layer in this order has an advantageous effect of improving the viewing angle while external light reflection is restrained.

Figure 8:
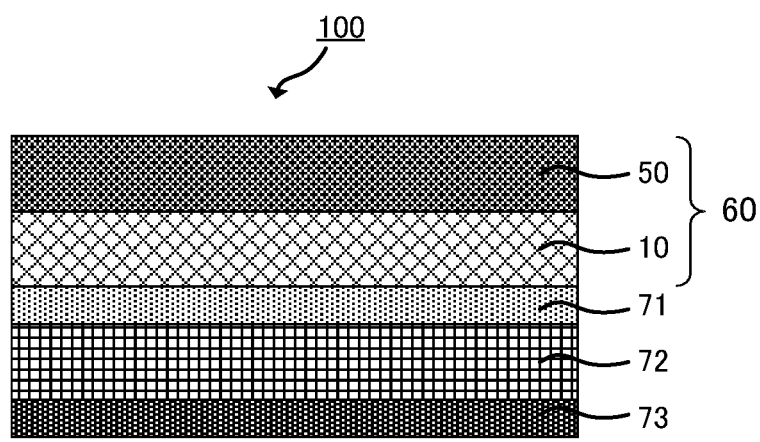
FIG. 8 is a schematic sectional view showing an embodiment of a display device.

The following will describe an example of a light emitting display device that is one embodiment, referring to a figure. FIG. 8 is a schematic sectional view showing one embodiment of the organic light emitting display device.

In the example in FIG. 8, which is an organic light emitting display device 100, a polarizing plate 50 is located on a light-emitting-out surface side of the same retardation film 10 as described above, and further this display device contains, on the surface of the retardation film that is opposite to the former surface, a transparent electrode layer 71, a light emitting layer 72, and an electrode layer 73 in this order.

The light emitting layer 72 contains, for example, a structure in which from the transparent electrode layer 71 side of the device, the following layers are laminated in turn: a hole injecting layer; a hole transporting layer; a light emitting layer; and an electron injecting layer. In the present embodiment, known layers and other constituents are appropriately used for the transparent electrode layer, the hole injecting layer, the hole transporting layer, the light emitting layer, the electron injecting layer, the electrode layer, and other constituents. The light emitting display device produced in this manner is applicable to, for example, an organic EL display in a passive driving manner, and an organic EL display in an active driving manner.

Incidentally, the display device in the present disclosure is not limited to the above-mentioned structure, and is applicable into an appropriately-selective known structure.

EXAMPLES

Synthesis Example 1: Synthesis of Liquid Crystal Monomer 1

Initially, in accordance with a scheme 1 illustrated below, 4-[2-(acryloyloxy)ethoxy]benzoic acid was synthesized.

Scheme 1

[Chem. 11]

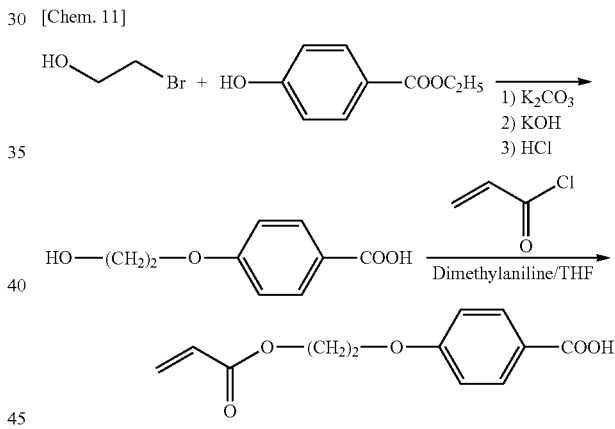

Next, in accordance with a scheme 2, a liquid crystal monomer 1 represented by a chemical formula (1) illustrated below was yielded. Specifically, to a suspension of 4-[2-(acryloyloxy)ethoxy]benzoic acid (179.4 g, 759.4 mmol), 4'-cyano-4-hydroxybiphenyl (148.3 g, 759.4 mmol), and N,N-dimethylaminopyridine (DMAP) (2.7 g, 22.8 mmol) in dichloromethane (DCM) (950 mL) was dropwise added a solution of N,N-dicyclohexylcarbodiimide (DCC) (170.8 g, 827.8 mmol) in dichloromethane (130 mL). After the end of the addition, the reaction system was stirred for 12 hours, and the precipitation was filtrated to be collected. Thereafter, the solvent was distilled off. To the resultant crude product was added methanol (1.8 L), and the resultant was stirred at room temperature for 1 hour to be suspended and purified. The precipitation was filtrated, and the resultant crystal was dried to yield 4'-cyano-4-{4-[2-(acryloyloxy)ethoxy]benzoate} (chemical formula (1) illustrated below) with a yield of 92.9% (301.1 g, 728.3 mmol).

Scheme 2

[Chem. 12]

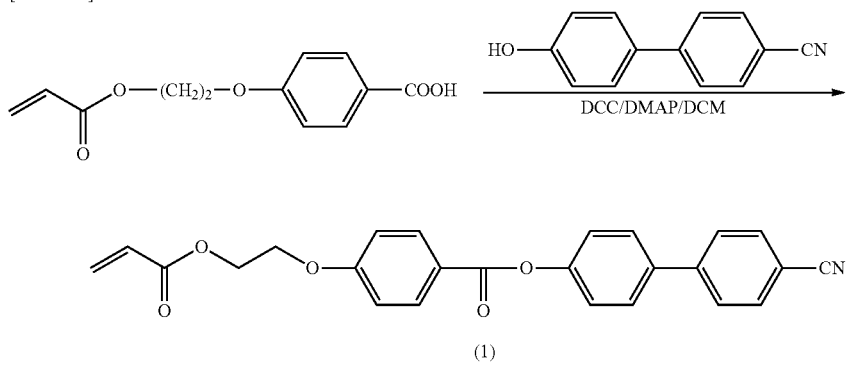

(1)

Synthesis Example 2: Synthesis of Liquid Crystal Monomer 2

A liquid crystal monomer 2 represented by a chemical formula (2) illustrated below was yielded in the same way as in Synthesis Example 1 except that in Synthesis Example 1, 6-chloro-1-n-hexanol was used instead of 2-bromoethanol.

[Chem. 13]

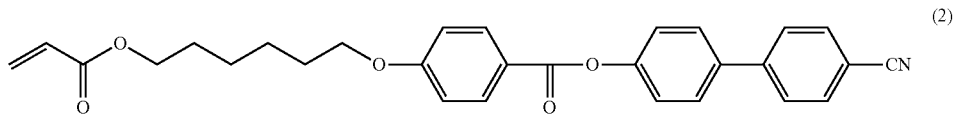

(2)

Synthesis Example 3: Synthesis of Liquid Crystal Monomer 3

Initially, in accordance with a scheme 3 illustrated below, 4-propoxycarbonylphenyl=4-hydroxybenzoate represented by a chemical formula (A) illustrated below was yielded. Specifically, to a suspension of 4-acetoxybenzoic acid (524.8 g, 2.9 mol), propyl 4-hydroxybenzoate (500 g, 2.8 mol), and N,N-dimethylaminopyridine (DMAP) (20.3 g, 0.2 mmol) in dichloromethane (2.5 L) was dropwise added a solution of N,N-dicyclohexylcarbodiimide (DCC) (601.3 g, 2.9 mol) in dicyclomethane (450 mL). After the end of the addition, the reaction system was stirred for 12 hours, and the precipitation was filtrated to be collected. Thereafter, the solvent was distilled off. Methanol (3.4 L) was added to the resultant oily substance to dissolve the substance, and then thereto was slowly and dropwise added a solution of potassium carbonate (446.1 g, 3.2 mol) in water (1.7 L) while the reaction system was cooled. The reaction mixture was stirred for 1 hour, and then neutralized with a 35% hydrochloric acid solution (325 mL). The precipitated crystal was filtrated to be collected. The crude product was dried to yield 4-propoxycarbonyphenyl-4-hydroxybenzoate with a two-stage yield of 72.9% (602.2 g, 2.0 mol). The synthesis of 4-propoxycarbonyphenyl-4-hydroxybenzoate according to the above-mentioned method was repeated two times.

Scheme 3

[Chem. 14]

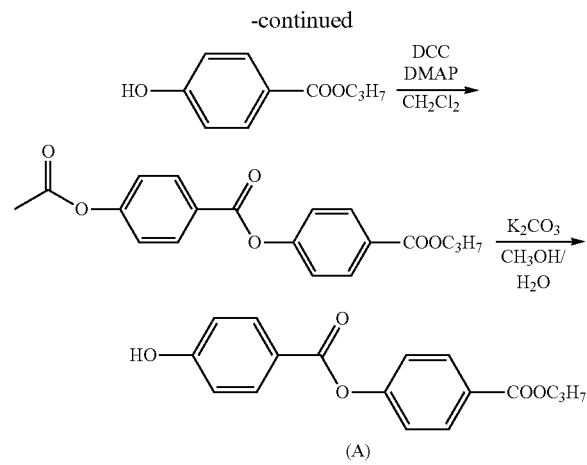

(A)

Next, in accordance with a scheme 4 illustrated below, a liquid crystal monomer 3 represented by a chemical formula (3) illustrated below was yielded. Specifically, to a suspension of 4-propoxycarbonylphenyl-4-hydroxybenzoate (664 g, 2.3 mol), 4-[6-(acryloyloxy)hexyloxy]benzoic acid (650 g, 2.2 mol), and N,N-dimethylaminopyridine (DMAP) (7.9 g, 0.1 mol) in dichloromethane (2.8 L) was dropwise added a solution of N,N-dicyclohexylcarbodiimide (DCC) (489.0 g, 2.4 mol) in dichloromethane (400 mL). After the end of the addition, the reaction system was stirred over night, and the precipitation was filtrated to be collected. Thereafter, the solvent was distillated off. Methanol (5.0 L) was added to the resultant crude product to dissolve the crude product, and then the system was cooled and stirred for 5 hours. The precipitated crystal was filtrated to be collected. The resultant crystal was dried to yield 4-[(4-propoxycarbonyphenyloxycarbonyl)phenyl-4-[6-(acryloyloxy)hexyloxy]benzoate with a yield of 87.7% (1091 g, 2.0 mol)).

dissolved in tetrahydrofuran (13 mL), and the resultant was stirred at 25° C. for 5 hours. Thereafter, the reaction liquid was dropwise added to water (1.2 L), and then ethyl acetate (1.0 L) was added thereto to perform extraction. Thereafter, the solvent in the resultant organic phase was distilled off. The residue was purified by silica gel chromatography, and the solvent was distilled off to yield 114 g of a monomer A represented by the following chemical formula (A):

Scheme 4

[Chem. 15]

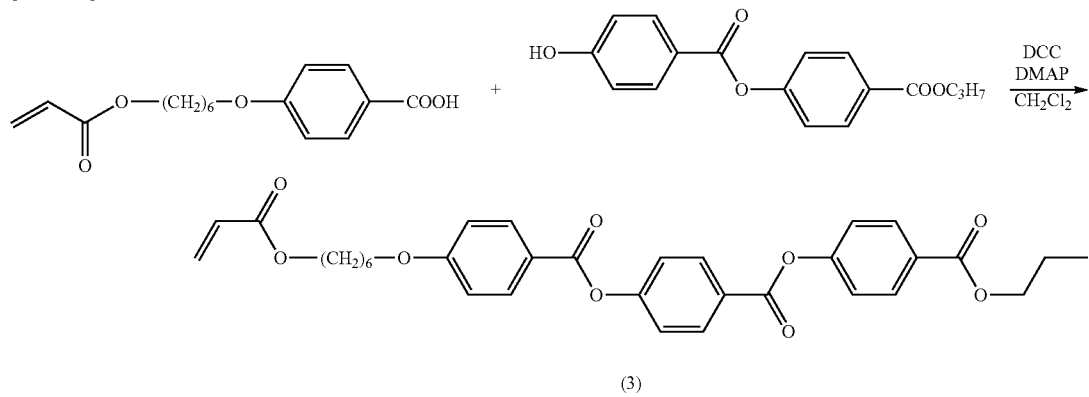

(3)

Synthesis Example 4: Synthesis of Monomer A

Into a 2-L-volume light-shielded four necked flask were charged 4-amylphenol (82.5 g, 502 mmol), 3-chloro-1-propanol (49.8 g, 527 mmol), potassium carbonate (83.3 g, 603 mmol), and N,N-dimethylformamide (210 mL). The temperature of the reaction system was raised to 100° C., and the system was stirred for 37 hours. Thereafter, this reaction liquid was naturally cooled to room temperature. Thereto was added water (413 mL), and the reaction liquid was stirred for 10 minutes. Thereafter, thereto was further added ethyl acetate (350 mL). The reaction liquid was stirred for 5 minutes, and then separated into two liquid phases. The separated water phase was again extracted with ethyl acetate (350 mL). The combined organic phase was washed with water (413 mL). Thereafter, the organic phase was washed with water (413 mL) and saturated salt water (150 mL). The resultant was separated into two liquid phases, and then the water phase was removed. The solvent was then distilled off. The residue was purified by silica gel chromatography, and the solvent was distilled off to yield 113.0 g of an ether product A. The synthesis of the ether product A by this method was repeated two times.

Next, into a 2-L-volume light-shielded four necked flask were charged the ether product A (114.5 g, 392 mmol), N,N-dimethylaniline (52.3 g, 432 mmol), N,N-dimethylacetamide (26.2 g), and tetrahydrofuran (375 mL), and then the flask was cooled until the internal temperature thereof turned to 15° C. or less. To the mixed liquid was dropwise added a solution in which acrylic chloride (56.8 g, 628 mmol) was

[Chem. 16]

Chemical Formula (A)

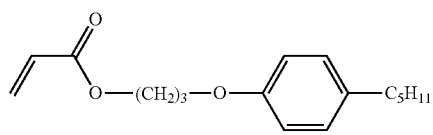

Synthesis Example 5: Synthesis of Monomer B

A monomer B represented by the following chemical formula (B) was yielded in the same way as in Synthesis Example 4 except that in Synthesis Example 4 instead of 3-chloro-1-propanol, 8-chloro-1-n-octanol was used:

[Chem. 17]

Chemical Formula (B)

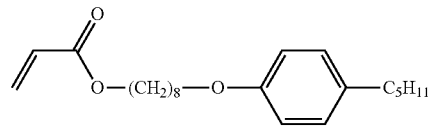

Synthesis Example 6: Synthesis of Monomer C

A monomer C represented by the following chemical formula (C) was yielded in the same way as in Synthesis Example 4 except that in Synthesis Example 4 instead of 4-amylphenol, 4-(trans-4-propylcyclohexyl)phenol was used:

[Chem. 18]

Chemical Formula (C)

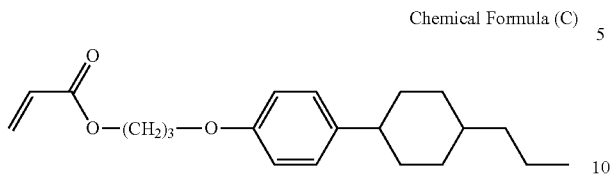

Synthesis Example 7: Synthesis of Monomer D

A monomer D represented by the following chemical formula (D) was yielded in the same way as in Synthesis Example 5 except that in Synthesis Example 5 instead of 4-amylphenol, 4-(trans-4-propylcyclohexyl)phenol was used:

[Chem. 19]

Chemical Formula (D)

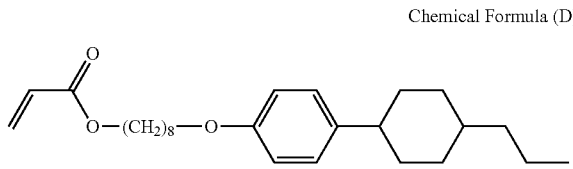

As a monomer E, a monomer F, and a monomer G, the following were used, respectively: ethyl acrylate (chemical formula (E) illustrated below), hexyl acrylate (chemical formula (F) illustrated below), and stearyl acrylate (chemical formula (G) illustrated below (these compounds were each manufactured by Tokyo Chemical Industry Co., Ltd.).

[Chem. 20]

Chemical Formula (E)

Chemical Formula (F)

Chemical Formula (G)

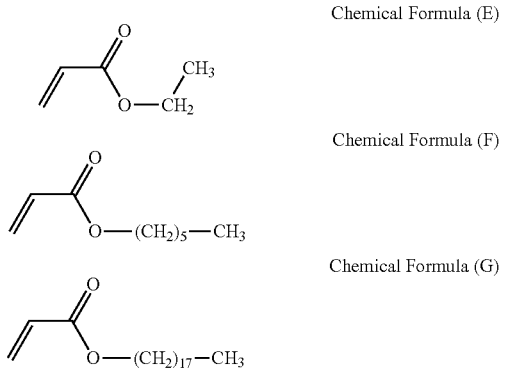

Moreover, as a monomer H, the following was used: nonylphenoxy polyethylene glycol acrylate (chemical formula (H) illustrated below) manufactured by Hitachi Chemical Co., Ltd. The monomer H was a mixture about which n' was from 1 to 8 in the chemical formula (H); and contained at least a monomer about which n' was 4 and a monomer about which n' was 8. The average of n's was 4.

[Chem. 21]

Chemical Formula (H)

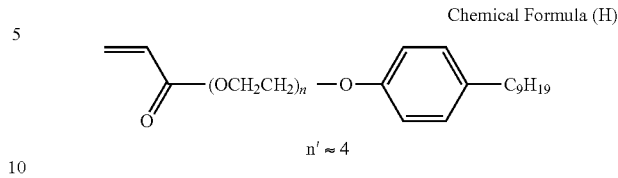

$n' \approx 4$

Moreover, as a monomer I, the following was used: nonylphenoxy polyethylene glycol acrylate (chemical formula (I) illustrated below) manufactured by Hitachi Chemical Co., Ltd. The monomer I was a mixture about which n' was from 1 to 12 in the chemical formula (I); and contained at least a monomer about which n' was 8 and a monomer about which n' was 12. The average of n's was 8.

[Chem. 22]

Chemical Formula (I)

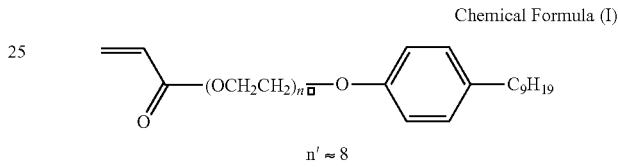

$n' \approx 8$

Moreover, as a monomer J, the following was used: nonylphenoxy polyethylene glycol acrylate (chemical formula (J) illustrated below) manufactured by Hitachi Chemical Co., Ltd. The monomer J contained a monomer about which n' was 16 and a monomer about which n' was 17.

[Chem. 23]

Chemical Formula (J)

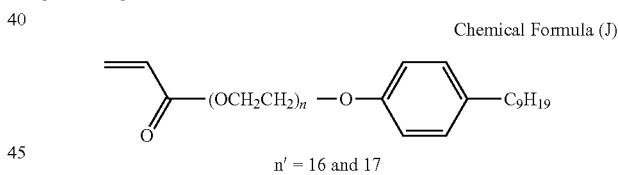

$n' = 16$ and $17$

As a monomer K, and a monomer L, the following were used, respectively: dodecyl acrylate (chemical formula (K) illustrated below), and hexadecyl acrylate (chemical formula (L) illustrated below) (each manufactured by Tokyo Chemical Industry Co., Ltd.).

[Chem. 24]

Chemical Formula (K)

Chemical Formula (L)

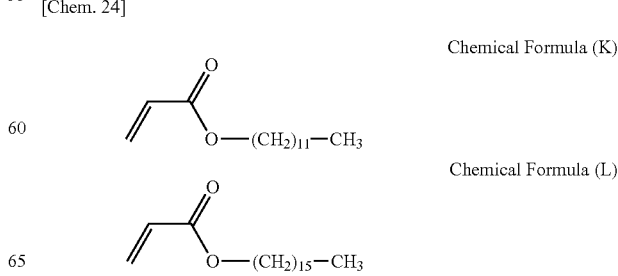

Production Example 1: Synthesis of Side-Chain Liquid Crystal Polymer

A side-chain liquid crystal polymer was synthesized by combining one of the monomers 1 to 3 with one or more of the monomers A to L in accordance with Table 1. Hereinafter, the monomers A to L may each be referred to as a non-liquid-crystal monomer.

A specific description will be made about a synthesis example of a side-chain liquid crystal polymer A-06.

The monomers A and B were combined with each other at a ratio by mole of 50/50, and the total of these non-liquid-crystal monomers were combined with the liquid crystal monomer 2 at a ratio by mole of 35/65 to be mixed with each other. To the mixture was added N,N-dimethylacetoamide (DMAc), and the resultant was stirred at 40° C. to dissolve them. After the dissolution, the reaction system was cooled to 24° C., and azoisobutyronitrile (AIBN) was added to the reaction system and dissolved at the same temperature. The reaction solution was dropwise added to DMAc heated to 80° C. over 30 minutes. After the end of the addition, the reaction system was stirred at 80° C. for 6 hours. After the end of the reaction, the reaction liquid was cooled to room temperature, and then dropwise added to another container in which methanol was stirred. The liquid was then stirred for 20 minutes. The supernatant was removed, and then the slurry was filtrated. The resultant crude product was again stirred in methanol for 20 minutes. The supernatant was removed, and then the rest was filtrated. The resultant crystal was dried to yield the side-chain liquid crystal polymer A-06 with a yield of 76.5%.

About the resultant side-chain liquid crystal polymer A-06, the mass-average molecular weight Mw was measured by GPC, and the structure thereof was analyzed by 1H-NMR. It was also verified by the above-mentioned methods Py-GC-MS and MALDI-TOFMS that the side-chain liquid crystal polymer contained constitutional units derived from the monomer A, and constitutional units derived from the monomer B.

<Side-Chain Liquid Crystal Polymer A-06>
Mass-average molecular weight Mw: 7400
$^1$H-NMR (400 MHz, DMSO-d6, TMS): 0.60 to 1.81 (m, Alkyl-H), 2.33 (bs benzyl-H), 3.57 to 4.32 (m, —O—CH2-), 6.80 to 7.73 (m, Aromatic-H), 8.12 (bs, CN—C=CH—)

Production Examples 2 to 18: Synthesis of Side-Chain Liquid Crystal Polymers

Each of side-chain liquid crystal polymers A-01 to A-05, and side-chain liquid crystal polymers A-07 to A-18 was yielded in the same way as in the synthesis example of the side-chain liquid crystal polymer A-06 except that in the synthesis example of the side-chain liquid crystal polymer A-06, the combination of two or more of the non-liquid-crystal monomers, and the blend ratio therebetween were changed as shown in Table 1, and further the liquid crystal monomer was selected in accordance with Table 1. Incidentally, about each of the side-chain liquid crystal polymers A-01 to A-18, the ratio between the non-liquid-crystal monomer and the liquid crystal monomer was a ratio by mole of 35/65.

About each of the resultant side-chain liquid crystal polymers, the mass-average molecular weight was measured, and the structure thereof was analyzed in the same way as used for the side-chain liquid crystal polymer A-06. It was also verified by the method Py-GC-MS or MALDI-TOFMS that the side-chain liquid crystal polymer contained constitutional units derived from the two or three used kinds of non-liquid-crystal monomers. The following will show the measured results.

<Side-Chain Liquid Crystal Polymer A-01>
Mass-average molecular weight Mw: 8000
$^1$H-NMR (400 MHz, DMSO-d6, TMS): 0.60 to 1.88 (m, Alkyl-H), 3.63 to 4.32 (m, —O—CH2-), 6.80 to 7.73 (m, Aromatic-H), 8.17 (bs, CN—C=CH—)

<Side-Chain Liquid Crystal Polymer A-02>
Mass-average molecular weight Mw: 4200
$^1$H-NMR (400 MHz, DMSO-d6, TMS): 0.58 to 1.89 (m, Alkyl-H), 3.63 to 4.20 (m, —O—CH2-), 6.80 to 7.73 (m, Aromatic-H), 8.17 (bs, CN—C=CH—)

<Side-Chain Liquid Crystal Polymer A-03>
Mass-average molecular weight Mw: 7800
$^1$H-NMR (400 MHz, DMSO-d6, TMS): 0.60 to 1.82 (m, Alkyl-H), 3.63 to 4.20 (m, —O—CH2-), 6.80 to 7.73 (m, Aromatic-H), 8.17 (bs, CN—C=CH—)

<Side-Chain Liquid Crystal Polymer A-04>
Mass-average molecular weight Mw: 55000
$^1$H-NMR (400 MHz, DMSO-d6, TMS): 0.55 to 1.89 (m, Alkyl-H), 3.61 to 4.27 (m, —O—CH2-), 6.80 to 7.73 (m, Aromatic-H), 8.18 (bs, CN—C=CH—)

<Side-Chain Liquid Crystal Polymer A-05>
Mass-average molecular weight Mw: 8200
$^1$H-NMR (400 MHz, DMSO-d6, TMS): 0.61 to 1.82 (m, Alkyl-H), 3.63 to 4.34 (m, —O—CH2-), 6.80 to 7.73 (m, Aromatic-H), 8.18 (bs, CN—C=CH—)

<Side-Chain Liquid Crystal Polymer A-07>
Mass-average molecular weight Mw: 8200
$^1$H-NMR (400 MHz, DMSO-d6, TMS): 0.58 to 1.89 (m, Alkyl-H), 2.45 (bs benzyl-H), 3.61 to 4.21 (m, —O—CH2-), 6.67 to 7.73 (m, Aromatic-H), 8.17 (bs, CN—C=CH—)

<Side-Chain Liquid Crystal Polymer A-08>
Mass-average molecular weight Mw: 8100
$^1$H-NMR (400 MHz, DMSO-d6, TMS): 0.59 to 1.84 (m, Alkyl-H), 3.63 to 4.32 (m, —O—CH2-), 6.80 to 7.72 (m, Aromatic-H), 8.17 (bs, CN—C=CH—)

<Side-Chain Liquid Crystal Polymer A-09>
Mass-average molecular weight Mw: 8100
$^1$H-NMR (400 MHz, DMSO-d6, TMS): 0.60 to 1.88 (m, Alkyl-H), 3.63 to 4.32 (m, —O—CH2-), 6.80 to 7.73 (m, Aromatic-H), 8.17 (bs, CN—C=CH—)

<Side-Chain Liquid Crystal Polymer A-10>
Mass-average molecular weight Mw: 7800
$^1$H-NMR (400 MHz, DMSO-d6, TMS): 0.60 to 1.88 (m, Alkyl-H), 3.63 to 4.32 (m, —O—CH2-), 6.98 to 7.72 (m, Aromatic-H)

<Side-Chain Liquid Crystal Polymer A-11>
Mass-average molecular weight Mw: 7300
$^1$H-NMR (400 MHz, DMSO-d6, TMS): 0.55 to 1.66 (m, Alkyl-H), 2.49 (bs benzyl-H), 3.77 to 4.17 (m, —O—CH2-), 6.80 to 7.73 (m, Aromatic-H), 8.11 (bs, CN—C=CH—)

<Side-Chain Liquid Crystal Polymer A-12>
Mass-average molecular weight Mw: 8200
$^1$H-NMR (400 MHz, DMSO-d6, TMS): 0.60 to 1.72 (m, Alkyl-H), 2.50 (bs benzyl-H), 3.78 to 4.17 (m, —O—CH2-), 6.76 to 7.73 (m, Aromatic-H), 8.15 (bs, CN—C=CH—)

<Side-Chain Liquid Crystal Polymer A-13>
Mass-average molecular weight Mw: 7600
$^1$H-NMR (400 MHz, DMSO-d6, TMS): 0.55 to 1.88 (m, Alkyl-H), 2.32 (bs benzyl-H), 3.77 to 4.17 (m, —O—CH2-), 6.80 to 7.70 (m, Aromatic-H), 8.11 (bs, CN—C=CH—)

<Side-Chain Liquid Crystal Polymer A-14>
Mass-average molecular weight Mw: 7600
¹H-NMR (400 MHz, DMSO-d6, TMS): 0.57 to 1.74 (m, Alkyl-H), 2.44 (bs benzyl-H), 3.63 to 4.20 (m, —O—CH2-), 6.80 to 7.73 (m, Aromatic-H), 8.11 (bs, CN—C=CH—)

<Side-Chain Liquid Crystal Polymer A-15>
Mass-average molecular weight Mw: 9600
¹H-NMR (400 MHz, DMSO-d6, TMS): 0.61 to 1.71 (m, Alkyl-H), 2.51 (bs benzyl-H), 3.60 to 4.31 (m, —O—CH2-), 6.81 to 7.70 (m, Aromatic-H), 8.15 (bs, CN—C=CH—)

<Side-Chain Liquid Crystal Polymer A-16>
Mass-average molecular weight Mw: 8900
¹H-NMR (400 MHz, DMSO-d6, TMS): 0.53 to 1.74 (m, Alkyl-H), 2.29 (bs benzyl-H), 3.13 to 4.59 (m, —O—CH2-), 6.72 to 7.75 (m, Aromatic-H), 8.12 (bs, CN—C=CH—)

<Side-Chain Liquid Crystal Polymer A-17>
Mass-average molecular weight Mw: 7800
¹H-NMR (400 MHz, DMSO-d6, TMS): 0.60 to 1.88 (m, Alkyl-H), 3.63 to 4.32 (m, —O—CH2-), 6.80 to 7.73 (m, Aromatic-H), 8.17 (bs, CN—C=CH—)

<Side-Chain Liquid Crystal Polymer A-18>
Mass-average molecular weight Mw: 7600
¹H-NMR (400 MHz, DMSO-d6, TMS): 0.55 to 1.84 (m, Alkyl-H), 3.63 to 4.32 (m, —O—CH2-), 6.80 to 7.73 (m, Aromatic-H), 8.17 (bs, CN—C=CH—)

Comparative Production Example 1: Synthesis of Side-Chain Liquid Crystal Polymer A-X1

A side-chain liquid crystal polymer A-X1 was synthesized in the same way as in the synthesis example of the side-chain liquid crystal polymer A-06 except that in the synthesis example of the side-chain liquid crystal polymer A-06, the non-liquid-crystal monomer was changed shown in Table 1.

About the resultant side-chain liquid crystal polymer A-X1, the mass-average molecular weight was measured, and the structure thereof was analyzed in the same way as used for the side-chain liquid crystal polymer A-06.

<Side-Chain Liquid Crystal Polymer A-X1>
Mass-average molecular weight Mw: 8600
¹H-NMR (400 MHz, DMSO-d6, TMS): 0.55 to 1.89 (m, Alkyl-H), 3.65 to 4.23 (m, —O—CH2-), 6.79 to 7.73 (m, Aromatic-H), 8.17 (bs, CN—C=CH—)

TABLE 1

| | Liquid crystal monomer | Non-liquid-crystal monomer a |
|---|---|---|
| A-01 | [structure] | [structure] |
| A-02 | [structure] | [structure] |
| A-03 | [structure] | [structure] |
| A-04 | [structure] | [structure] |
| A-05 | [structure] | [structure] |
| A-06 | [structure] | [structure] |

TABLE 1-continued
| | | |
|---|---|---|
| A-07 | 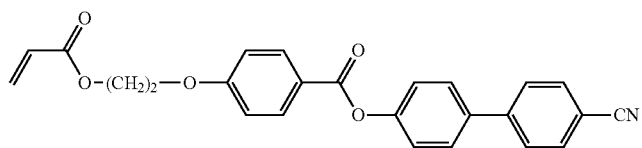 | 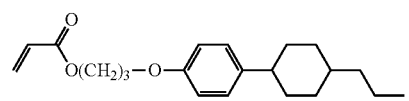 |
| A-08 | 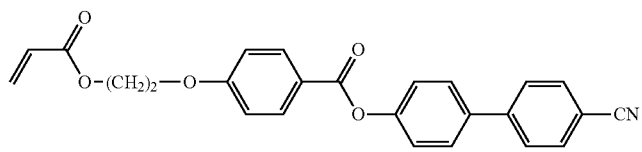 | 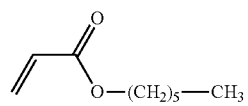 |
| A-09 | 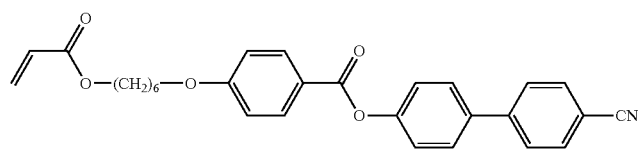 | 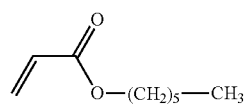 |
| A-10 | 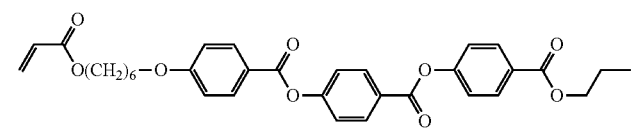 | 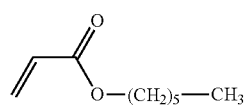 |
| A-11 | 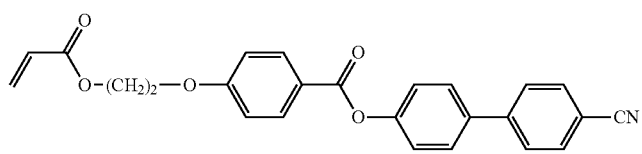 | 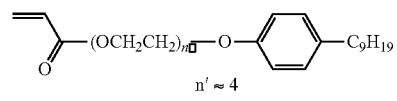 n' ≈ 4 |
| A-12 | 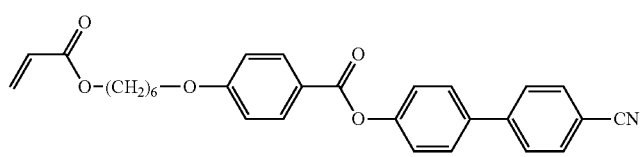 | 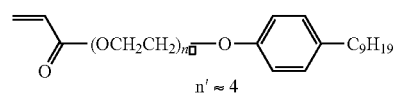 n' ≈ 4 |
| A-13 | 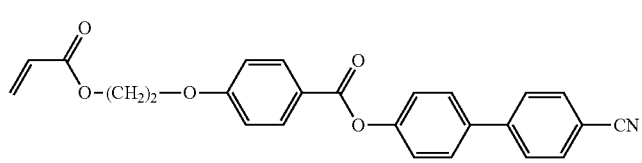 | 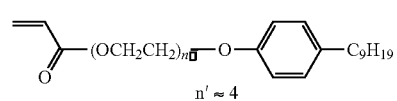 n' ≈ 4 |
| A-14 | 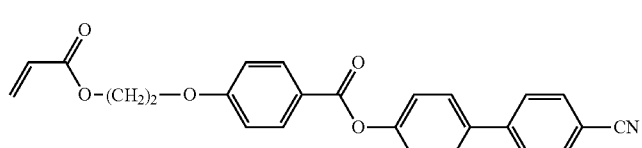 | 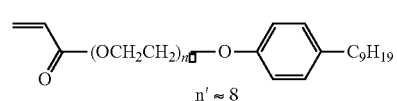 n' ≈ 8 |
| A-15 | 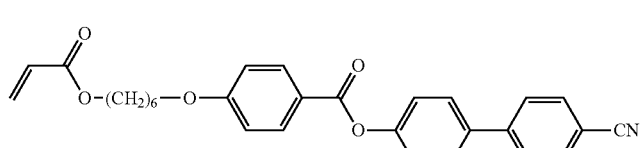 | 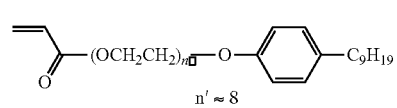 n' ≈ 8 |
| A-16 | 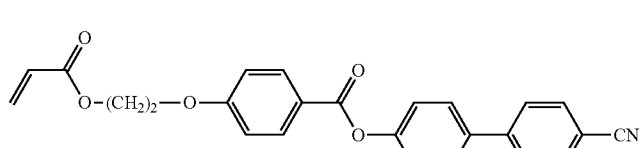 | 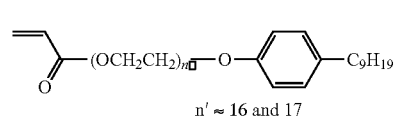 n' ≈ 16 and 17 |

TABLE 1-continued
| | | Non-liquid-crystal monomer | | Composition ratio |
|---|---|---|---|---|
| | | b | c | a:b:c |
| | | | | |
|---|---|---|---|---|
| A-17 | 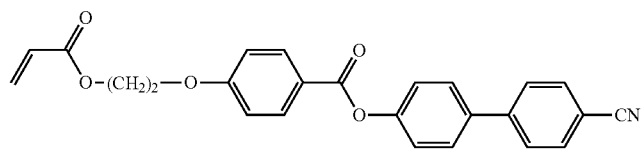 | | 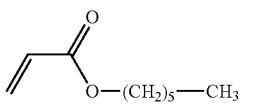 | |
| A-18 | 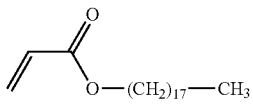 | | 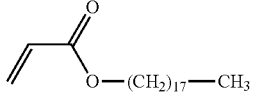 | |
| Comparative A-X1 | 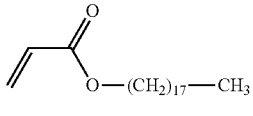 | | 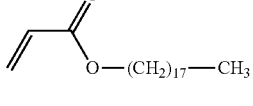 | |
| A-01 | | 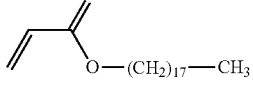 | — | 20:80:0 |
| A-02 | | 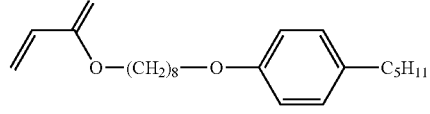 | — | 50:50:0 |
| A-03 | | 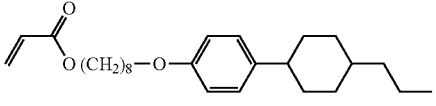 | — | 50:50:0 |
| A-04 | | 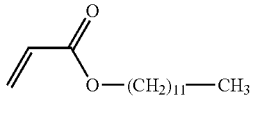 | — | 50:50:0 |
| A-05 | | 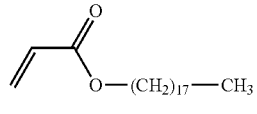 | — | 50:50:0 |
| A-06 | | 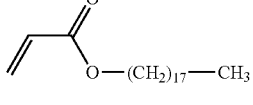 | — | 50:50:0 |
| A-07 | |  | — | 50:50:0 |
| A-08 | |  |  | 30:35:35 |
| A-09 | |  | — | 50:50:0 |

TABLE 1-continued

| | | | |
|---|---|---|---|
| A-10 | 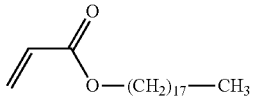 | — | 50:50:0 |
| A-11 | — | — | 100:0:0 |
| A-12 | — | — | 100:0:0 |
| A-13 | 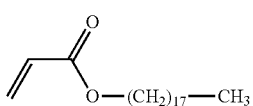 | — | 50:50:0 |
| A-14 | — | — | 100:0:0 |
| A-15 | — | — | 100:0:0 |
| A-16 | — | — | 100:0:0 |
| A-17 | 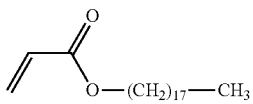 | — | 10:90:0 |
| A-18 | 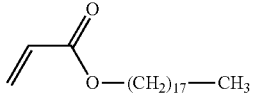 | — | 50:50:0 |
| Comparative A-X1 | — | — | 100:0:0 |

As polymerizable liquid crystal compounds, a compound of the following chemical formula B-01, and a compound of the following chemical formula B-02 were prepared.

[Chem. 25]

Chemical Formula B-01

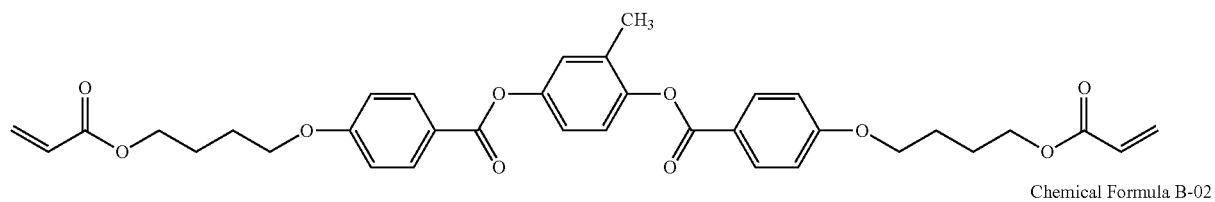

Chemical Formula B-02

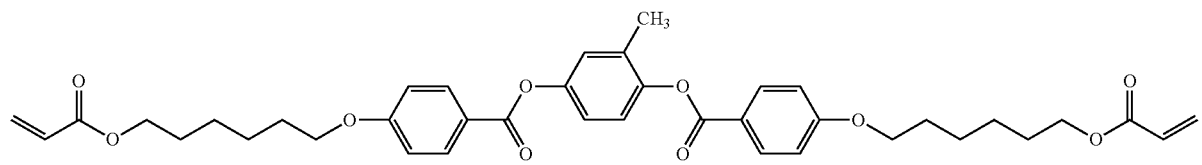

As photopolymerization initiators, the following C-01 and C-02 were prepared (each manufactured by BASF Corp.).
C-01: IRGACURE 907
C-02: IRGACURE 184

As a levelling agent, a fluorine-containing surfactant D-01 (MEGAFACE F-554, manufactured by DIC Corp.) was prepared.

Example 1: Preparation of Liquid Crystal Composition

A liquid crystal composition 1 was prepared by dissolving, into 400 parts by mass of cyclohexanone, 50 parts by mass of the side-chain liquid crystal polymer (A-01), 50 parts by mass of the photopolymerizable liquid crystal compound (B-01), and 4 parts by mass of the photopolymerization initiator (C-01: IRGACURE 907, manufactured by Ciba Specialty Chemicals Inc.).

Examples 2 to 23: Preparation of Liquid Crystal Compositions 2 to 23

Liquid crystal compositions 2 to 23 were each yielded in the same way as in Example 1 except that in Example 1, the composition of the individual components was changed in accordance with in Table 2.

Comparative Examples 1 to 2: Preparations of Comparative Liquid Crystal Compositions X1 to X2

Comparative liquid crystal compositions X1 to X2 were each yielded in the same way as in Example 1 except that in Example 1, the composition of the individual components was changed in accordance with in Table 2.

[Evaluations]

(Production of Retardation Films or Transfer Laminates)

The following four components were mixed with each other at a ratio by mass of 1/1/4/5: 2-phenoxyethyl acrylate; tetrahydrofurfuryl acrylate; dipentaerythritol triacrylate; and bis(2-vinyloxyethyl) ether. Furthermore, a product Lucirin TPO (manufactured by BASF Corp.) was added thereinto as a polymerization initiator to give a proportion of 4% by mass. In this way, a mixture was prepared as a composition for homeotropic alignment membranes.

A PET substrate of 38 μm thickness was used, and a single surface thereof was coated with the composition for homeotropic alignment membranes to give a membrane thickness of 3 μm. The membrane was irradiated with ultraviolet rays of 20 mJ/cm² to produce an alignment membrane.

Subsequently, the liquid crystal composition of each of the working examples and the comparative examples was applied onto a piece from the formed alignment membrane in a die head coating manner to adjust the flow rate of the composition, at the time of the applying, so as to give a thickness retardation Rth (550) of −100 nm at a measuring wavelength of 550 nm. In this way, the liquid crystal composition was formed into a film. Thereafter, the film was dried at a drying temperature shown in Table 2 for 120 seconds, and then irradiated with ultraviolet rays (UV) to form a retardation layer. In this way, each retardation film or transfer laminate was yielded.

For the measurement of the thickness retardation value, the retardation layer was transferred onto a stickiness-attached glass piece, and an instrument KOBRA-WR manufactured by Oji Scientific Instruments Co., Ltd. was used to measure the value.

<In-Plane Uniformity Evaluation>

Each of the retardation layers of the retardation films or transfer laminates yielded as descried above was transferred onto a stickiness-attached glass piece, and the instrument KOBRA-WR manufactured by Oji Scientific Instruments Co., Ltd. was used to measure the retardation value Rth of light having a wavelength of 550 nm. An area of 10 cm square was set in the outer surface of the retardation layer, and in this area the measurement was made in each of ten points of the area. The in-plane uniformity of the retardation layer was evaluated on the basis of the difference (ΔRth) between the maximum value and the minimum value of the resultant retardation values. The results are shown in Table 2.

(Evaluating Criterion)

A: the ΔRth is 2 nm or less,

B: the ΔRth is more than 2 nm, and 3 nm or less, or

C: the ΔRth is more than 3 nm.

When any retardation film or transfer laminate has an in-plane uniformity evaluation of A or B, this member is excellent in in-plane uniformity of retardation value.

<Bending Evaluation>

Each of the retardation films or transfer laminates as described above was made into a test piece of 50 mm×100 mm size, and the test piece was set to a mandrel bending tester to direct the coated film surface of the test piece outward. A mandrel of 2 mm diameter was used to bend the test piece. The resistance of the test piece to bending was evaluated, using the number of times of bending the piece until the piece was cracked or broken. The results are shown in Table 2.

(Evaluating Criterion)

A: Even when a test piece is bent 100000 times or more, the piece is not cracked or broken, B: When a test piece is bent 50000 times or more and less than 100000 times, the piece is cracked or broken, or C: When a test piece is bent less than 50000 times, the piece is cracked or broken.

When any retardation film or transfer laminate has a bending evaluation of A or B, this member is excellent in resistance to bending.

TABLE 2

|  | Component A | | Component B | | Component C | | Component D | |
|---|---|---|---|---|---|---|---|---|
|  | Species | Addition amount | Species | Addition amount | Species | Addition amount | Species | Addition amount |
| Example 1 | A-01 | 50 | B-01 | 50 | C-01 | 4 | — | — |
| Example 2 | A-02 | 50 | B-01 | 50 | C-01 | 4 | — | — |
| Example 3 | A-03 | 50 | B-01 | 50 | C-01 | 4 | — | — |
| Example 4 | A-03 | 50 | B-01 | 95 | C-01 | 4 | — | — |
| Example 5 | A-03 | 30 | B-01 | 70 | C-01 | 4 | — | — |
| Example 6 | A-03 | 50 | B-02 | 50 | C-01 | 4 | — | — |
| Example 7 | A-03 | 50 | B-01 | 50 | C-02 | 4 | — | — |
| Example 8 | A-03 | 50 | B-01 | 50 | C-01 | 4 | D-01 | 0.002 |
| Example 9 | A-04 | 50 | B-01 | 50 | C-01 | 4 | — | — |
| Example 10 | A-05 | 50 | B-01 | 50 | C-01 | 4 | — | — |
| Example 11 | A-06 | 50 | B-01 | 50 | C-01 | 4 | — | — |
| Example 12 | A-07 | 50 | B-01 | 50 | C-01 | 4 | — | — |
| Example 13 | A-08 | 50 | B-01 | 50 | C-01 | 4 | — | — |
| Example 14 | A-09 | 50 | B-01 | 50 | C-01 | 4 | — | — |
| Example 15 | A-10 | 50 | B-01 | 50 | C-01 | 4 | — | — |
| Example 16 | A-11 | 50 | B-01 | 50 | C-01 | 4 | — | — |
| Example 17 | A-12 | 50 | B-01 | 50 | C-01 | 4 | — | — |
| Example 18 | A-13 | 50 | B-01 | 50 | C-01 | 4 | — | — |
| Example 19 | A-14 | 50 | B-01 | 50 | C-01 | 4 | — | — |
| Example 20 | A-15 | 50 | B-01 | 50 | C-01 | 4 | — | — |
| Example 21 | A-16 | 50 | B-01 | 50 | C-01 | 4 | — | — |
| Example 22 | A-17 | 50 | B-01 | 50 | C-01 | 4 | — | — |
| Example 23 | A-18 | 50 | B-01 | 50 | C-01 | 4 | — | — |

TABLE 2-continued

| | | | | | | | | |
|---|---|---|---|---|---|---|---|---|
| Comparative Example 1 | Comparative A-X1 | 50 | B-01 | 50 | C-01 | 4 | — | — |
| Comparative Example 2 | Comparative A-X1 | 30 | B-01 | 70 | C-01 | 4 | — | — |

| | Homeotropically aligning temperature | | Drying | In-plane uniformity of retardation | Evaluating of resistance |
|---|---|---|---|---|---|
| | Lower limit | Upper limit | temperature | value | to bending |
| Example 1 | 50 | 120 | 60 | A | A |
| Example 2 | 50 | 110 | 50 | A | A |
| Example 3 | 50 | 120 | 60 | A | A |
| Example 4 | 75 | 120 | 85 | A | B |
| Example 5 | 70 | 120 | 80 | A | A |
| Example 6 | 50 | 120 | 55 | A | A |
| Example 7 | 50 | 120 | 60 | A | A |
| Example 8 | 50 | 120 | 55 | A | A |
| Example 9 | 60 | 130 | 70 | A | A |
| Example 10 | 50 | 120 | 60 | A | A |
| Example 11 | 45 | 120 | 65 | A | A |
| Example 12 | 45 | 120 | 65 | A | A |
| Example 13 | 50 | 120 | 60 | A | A |
| Example 14 | 55 | 120 | 55 | A | A |
| Example 15 | 65 | 120 | 75 | A | A |
| Example 16 | 40 | 120 | 55 | A | A |
| Example 17 | 40 | 120 | 55 | A | A |
| Example 18 | 45 | 120 | 60 | A | A |
| Example 19 | 45 | 120 | 60 | A | A |
| Example 20 | 45 | 120 | 60 | A | A |
| Example 21 | 45 | 120 | 60 | A | A |
| Example 22 | 65 | 120 | 90 | A | B |
| Example 23 | 60 | 120 | 90 | B | B |
| Comparative Example 1 | 80 | 120 | 90 | C | C |
| Comparative Example 2 | 110 | 120 | 120 | C | C |

SUMMARY OF RESULTS

From the results in Table 2, it is made evident that the retardation films of Examples 1 to 23 are excellent in in-plane uniformity, and also excellent in resistance to bending, these retardation films being each a film containing the side-chain liquid crystal polymer in the present disclosure, which contains two or more kinds of constitutional units that are each represented by the general formula (I) and are different from each other in carbon atom number of the linking group represented by $L^1$ or $L^{1'}$, and which contains a liquid crystal constitutional unit containing a side chain including a liquid crystal moiety.

REFERENCE SIGNS LIST

1 Retardation layer
2, 2' Substrate
3 Alignment membrane
10 Retardation film
11, 21, 31 Retardation layer
12, 22, 32 Second substrate
13, 23, 33 Alignment membrane
15, 25, 35 Substrate peelable to be removed
16, 26, 36 Retardation layer supplied to be transferred
17 Interface between alignment membrane and retardation layer
27 Interface between second substrate and alignment membrane
20, 30, 40 Transfer laminate
50 Polarizing plate
60 Optical member
71 Transparent electrode layer
72 Light emitting layer
73 Electrode layer
100 Light emitting display device

The invention claimed is:
1. A side-chain liquid crystal polymer comprising
a liquid crystal constitutional unit which contains a side chain including a liquid crystal moiety, and
two or more kinds of constitutional units which are represented by the following general formula (I),
wherein
the two or more kinds of constitutional units represented by the following general formula (I) include
a constitutional unit (a) which is represented by the following general formula (I) and
a constitutional unit (b) which is represented by the following general formula (I) and is different from the constitutional unit (a) in carbon atom number of a linking group represented by $L^{1'}$:

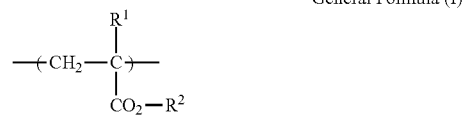

General Formula (I)

where
$R^1$ is a hydrogen atom or a methyl group;
$R^2$ is a group represented by $-L^{1'}-R^4$;

$L^{1'}$ is the linking group and represented by —$(C_2H_4O)_{n'}$—;

each $R^4$ is independently an alkyl group or an aryl group optionally containing an alkyl group; and each n' includes an integer of 4 or more and 18 or less.

2. The side-chain liquid crystal polymer according to claim 1, wherein the liquid crystal constitutional unit includes a constitutional unit represented by the following general formula (II):

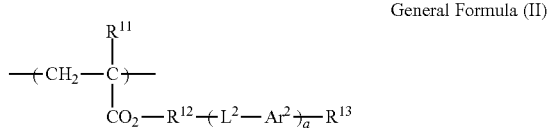

General Formula (II)

where $R^{11}$ is a hydrogen atom or a methyl group;

$R^{12}$ is a group represented by —$(CH_2)_m$— or —$(C_2H_4O)_{m'}$—;

$L^2$ is a direct bond or a linking group represented by —O—, —O—C(=O)— or —C(=O)—O—;

$Ar^2$ is an arylene group containing 6 or more and 10 or less carbon atoms and optionally containing a substituent group;

$L^2$s may be the same as or different from each other, and $Ar^2$s may be the same as or different from each other;

$R^{13}$ is —F, —Cl, —CN, —$OCF_3$, —$OCF_2H$, —NCO, —NCS, —$NO_2$, —NHC(=O)—$R^{14}$, —C(=O)—$OR^{14}$, —OH, —SH, —CHO, —$SO_3H$, —$NR^{14}{}_2$, —$R^{15}$, or —$OR^{15}$;

$R^{14}$ is a hydrogen atom or an alkyl group containing 1 or more and 6 or less carbon atoms;

$R^{15}$ is an alkyl group containing 1 or more and 6 or less carbon atoms;

a is an integer of 2 or more and 4 or less; and m and m' are each independently an integer of 2 or more and 10 or less.

3. A liquid crystal composition comprising
the side-chain liquid crystal polymer according to claim 1,
a polymerizable liquid crystal compound, and
a photopolymerization initiator.

4. A retardation film comprising a retardation layer, wherein the retardation layer contains the side-chain liquid crystal polymer according to claim 1.

5. A retardation film comprising a retardation layer, wherein the retardation layer contains a cured product of a liquid crystal composition containing the side-chain liquid crystal polymer according to claim 1 and a polymerizable liquid crystal compound.

6. A method for producing a retardation film, wherein a retardation layer is formed by:
a step of forming, into a film, a liquid crystal composition containing the side-chain liquid crystal polymer according to claim 1, a polymerizable liquid crystal compound and a photopolymerization initiator,
a step of aligning the liquid crystal constitutional unit of the side-chain liquid crystal polymer and the polymerizable liquid crystal compound in the liquid crystal composition formed into the film, and
a step of polymerizing the polymerizable liquid crystal compound after the aligning step.

7. A transfer laminate configured to transfer a retardation layer, the transfer laminate comprising a retardation layer and
a support supporting the retardation layer in a removable manner,
wherein
the retardation layer contains a cured product of a liquid crystal composition containing the side-chain liquid crystal polymer according to claim 1, and a polymerizable liquid crystal compound.

8. An optical member comprising the retardation film according to claim 5 and a polarization plate disposed thereon.

9. A method for producing an optical member, the method comprising:
a step of preparing a transfer laminate configured to transfer a retardation layer, wherein the transfer laminate comprises a retardation layer and a support supporting the retardation layer in a removable manner, and wherein the retardation layer contains a cured product of a liquid crystal composition containing a side-chain liquid crystal polymer and a polymerizable liquid crystal compound,
a transfer step in which a transfer receiving object comprising at least a polarization plate, is faced to the retardation layer of the transfer laminate, and the transfer laminate is transferred onto the transfer receiving object, and
a removal step in which the support is removed from the transfer laminate transferred onto the transfer receiving object,
wherein
the side-chain liquid crystal polymer comprises
a liquid crystal constitutional unit which contains a side chain including a liquid crystal moiety, and
two or more kinds of constitutional units which are represented by the following general formula (I),
wherein
the two or more kinds of constitutional units represented by the following general formula (I) include
a constitutional unit (a) which is represented by the following general formula (I) and
a constitutional unit (b) which is represented by the following general formula (I) and is different from the constitutional unit (a) in carbon atom number of a linking group represented by $L^1$ or $L^{1'}$:

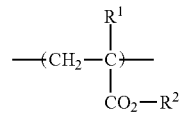

General Formula (I)

where $R^1$ is a hydrogen atom or a methyl group;

$R^2$ is a group represented by -$L^1$-$R^3$ or -$L^{1'}$-$R^4$;

$L^1$ is the linking group and represented by —$(CH_2)_n$—;

$L^{1'}$ is the linking group and represented by —$(C_2H_4O)_{n'}$—;

$R^3$ is a methyl group optionally containing a substituent group, an aryl group optionally containing an alkyl group, or –$OR^5$;

$R^4$ and $R^5$ are each independently an alkyl group optionally containing a substituent group or an aryl group optionally containing a substituent group; and n and n' are each independently an integer of 1 or more and 18 or less.

10. A display device
comprising the retardation film according to claim 5
or
comprising an optical member comprising the retardation film according to claim 5 and a polarization plate disposed thereon.

11. The side-chain liquid crystal polymer according to claim 1, wherein the two or more kinds of constitutional units represented by the general formula (I) include the constitutional units in which the difference between the numbers of carbon atoms included in the respective linking groups represented by $L^{1'}$ is 5 or more.

12. The side-chain liquid crystal polymer according to claim 1, wherein the two or more kinds of constitutional units are formed from non-liquid crystal monomers.

13. The liquid crystal composition according to claim 3, wherein the polymerizable liquid crystal compound is one or more compounds selected from compounds each represented by the following general formula (III) and compounds each represented by the following general formula (IV):

General Formula (III)

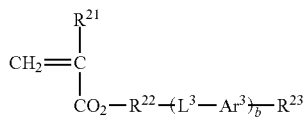

where
$R^{21}$ represents a hydrogen atom or a methyl group;
$R^{22}$ represents a group represented by —$(CH_2)_p$—, or —$(C_2H_4O)_p$—;
$L^3$ represents a direct bond or a linking group represented by —O—, —O—C(=O)—, or —C(=O)—O—;
$Ar^3$ represents an arylene group containing 6 or more and 10 or less carbon atoms and optionally containing a substituent;
plural $L^3$s and plural $Ar^3$s may be the same or different from each other;
$R^{23}$ represents —F, —Cl, —CN, —$OCF_3$, —$OCF_2H$, —NCO, —NCS, —$NO_2$, —NHC(=O)—$R^{24}$, —C(=O)—$OR^{24}$, —OH, —SH, —CHO, —$SO_3H$, —$NR^{24}{}_2$, —$R^{25}$, or —$OR^{25}$;
$R^{24}$ represents a hydrogen atom, or an alkyl group containing 1 or more and 6 or less carbon atoms;
$R^{25}$ represents an alkyl group containing 1 or more and 6 or less carbon atoms;
b is an integer of 2 or more and 4 or less;
p and p' are each independently an integer of 2 or more and 10 or less;

General Formula (IV)

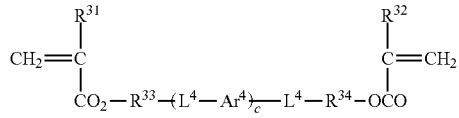

where
$R^{31}$ and $R^{32}$ each independently represent a hydrogen atom, or a methyl group;
$R^{33}$ represents a group represented by —$(CH_2)_q$—, or —$(C_2H_4O)_q$—;
$R^{34}$ represents a group represented by —$(CH_2)_r$— or —$(OC_2H_4)_r$—;
$L^4$ represents a direction bond or a linking group represented by —O—, —O—C(=O)—, or —C(=O)—O—;
$Ar^4$ represents an arylene group containing 6 or more and 10 or less carbon atoms and optionally containing a substituent;
plural $L^4$s and $Ar^4$s may be the same as or different from each other;
c is an integer of 2 or more and 4 or less; and
q, q', r and r' are each independently an integer 2 or more and 10 or less.

14. The liquid crystal composition according to claim 3, wherein the content proportion of the side-chain liquid crystal polymer is 10 parts or more and 60 parts or less by mass for 100 parts by mass of solid components in the liquid crystal composition.

15. A liquid crystal composition comprising
a side-chain liquid crystal polymer,
a polymerizable liquid crystal compound, and
a photopolymerization initiator,
wherein the polymerizable liquid crystal compound includes a polymerizable liquid crystal compound containing a mesogen and polymerizable groups at both terminals of the mesogen, and
wherein the side-chain liquid crystal polymer comprises
a liquid crystal constitutional unit which contains a side chain including a liquid crystal moiety, and
two or more kinds of constitutional units which are represented by the following general formula (I),
wherein the two or more kinds of constitutional units represented by the following general formula (I) include a constitutional unit (a) which is represented by the following general formula (I) and a constitutional unit (b) which is represented by the following general formula (I) and is different from the constitutional unit (a) in carbon atom number of a linking group represented by $L^1$ or $L^{1'}$:

General Formula (I)

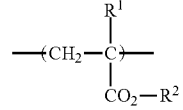

where
$R^1$ is a hydrogen atom or a methyl group;
$R^2$ is a group represented by -$L^1$-$R^3$ or -$L^{1'}$-$R^4$;
$L^1$ is the linking group and represented by —$(CH_2)_n$—;
$L^{1'}$ is the linking group and represented by —$(C_2H_4O)_{n'}$—;
$R^3$ is a methyl group, an aryl group optionally containing an alkyl group, or –$OR^5$;
$R^4$ and $R^5$ are each independently an alkyl group or an aryl group optionally containing an alkyl group; and
n and n' are each independently an integer of 1 or more and 18 or less.

16. The liquid crystal composition according to claim 15, wherein the polymerizable liquid crystal compound containing polymerizable groups at both terminals of its mesogen respectively is one or more compounds selected from compounds each represented by the following general formula (IV):

General Formula (IV)

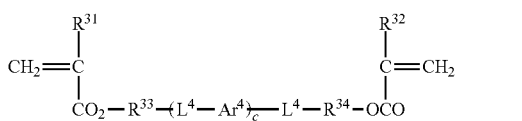

where
- $R^{31}$ and $R^{32}$ each independently represent a hydrogen atom, or a methyl group;
- $R^{33}$ represents a group represented by $-(CH_2)_q-$, or $-(C_2H_4O)_{q'}-$;
- $R^{34}$ represents a group represented by $-(CH_2)_r-$ or $-(OC_2H_4)_{r'}-$;
- $L^4$ represents a direction bond or a linking group represented by $-O-$, $-O-C(=O)-$, or $-C(=O)-O-$;
- $Ar^4$ represents an arylene group containing 6 or more and 10 or less carbon atoms and optionally containing a substituent;
- plural $L^4$s, as well as $Ar^4$s, may be the same as or different from each other;
- c is an integer of 2 or more and 4 or less; and
- q, q', r, and r' are each independently an integer 2 or more and 10 or less.

17. A retardation film comprising a retardation layer, wherein the retardation layer contains a cured product of the liquid crystal composition according to claim 15.

18. A method for producing a retardation film, wherein a retardation layer is formed by:
    a step of forming, into a film, the liquid crystal composition according to claim 15,
    a step of aligning the liquid crystal constitutional unit of the side-chain liquid crystal polymer and the polymerizable liquid crystal compound in the liquid crystal composition formed into the film, and
    a step of polymerizing the polymerizable liquid crystal compound after the aligning step.

19. A transfer laminate configured to transfer a retardation layer,
    the transfer laminate comprising a retardation layer and a support supporting the retardation layer in a removable manner,
    wherein the retardation layer contains a cured product of the liquid crystal composition according to claim 15.

20. An optical member comprising the retardation film according to claim 17 and a polarization plate disposed thereon.

21. A display device comprising the retardation film according to claim 17 or comprising an optical member comprising the retardation film according to claim 17 and a polarization plate disposed thereon.

* * * * *